United States Patent
Tsao et al.

(10) Patent No.: US 12,183,731 B2
(45) Date of Patent: Dec. 31, 2024

(54) DUMMY DEVICE FOR CORE DEVICE TO OPERATE IN A SAFE OPERATING AREA AND METHOD FOR MANUFACTURING THE SAME

(71) Applicant: TAIWAN SEMICONDUCTOR MANUFACTURING COMPANY LTD., Hsinchu (TW)

(72) Inventors: Szu-Chun Tsao, Hsinchu (TW); Jaw-Juinn Horng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 682 days.

(21) Appl. No.: 17/235,822

(22) Filed: Apr. 20, 2021

(65) Prior Publication Data

US 2022/0231014 A1    Jul. 21, 2022

Related U.S. Application Data

(60) Provisional application No. 63/138,744, filed on Jan. 18, 2021.

(51) Int. Cl.
*H01L 27/088* (2006.01)
*H01L 21/8234* (2006.01)
*H01L 27/02* (2006.01)
*H03K 17/687* (2006.01)

(52) U.S. Cl.
CPC ........ *H01L 27/088* (2013.01); *H01L 21/8234* (2013.01); *H01L 27/0207* (2013.01); *H03K 17/6871* (2013.01)

(58) Field of Classification Search
CPC ............... H01L 27/088; H01L 21/8234; H01L 27/0207; H03K 17/6871; H03K 17/04106; H03K 17/08104; G05F 1/56
See application file for complete search history.

(56) References Cited

U.S. PATENT DOCUMENTS

| | | | | |
|---|---|---|---|---|
| 9,054,214 | B1* | 6/2015 | Baldwin | H01L 27/0207 |
| 11,527,625 | B1* | 12/2022 | Chang | H01L 21/823462 |
| 2016/0173085 | A1* | 6/2016 | Chiang | H03K 19/00384 327/109 |
| 2017/0018612 | A1* | 1/2017 | Ito | H01L 29/42368 |
| 2021/0384903 | A1* | 12/2021 | Froidevaux | H03K 17/6872 |

* cited by examiner

*Primary Examiner* — Fernando L Toledo
*Assistant Examiner* — Jahae Kim
(74) *Attorney, Agent, or Firm* — WPAT LAW; Anthony King

(57) ABSTRACT

A semiconductor device and a method for a method for manufacturing a semiconductor device are provided. The semiconductor device comprises a core transistor having a drain configured to receive a first voltage, and a first dummy device connected to the drain of the core transistor, the first dummy device having a first dummy transistor and a second dummy transistor. Wherein a gate and a source of the first dummy transistor are connected to each other. Wherein a drain of the second dummy transistor is connected to the source of the first dummy transistor. Wherein a gate of the second dummy transistor is connected to the drain of the core transistor.

20 Claims, 19 Drawing Sheets

DUMMY DEVICE FOR CORE DEVICE TO OPERATE IN A SAFE OPERATING AREA AND METHOD FOR MANUFACTURING THE SAME

CROSS REFERENCE TO RELATED APPLICATIONS

This application is related to Applicant's previously filed U.S. Application Ser. No. 63/138,744, filed Jan. 18, 2021, which is herein incorporated by reference.

BACKGROUND

The present disclosure relates, in general, to semiconductor devices and methods for manufacturing the same. Specifically, the present disclosure relates to semiconductor devices that include dummy devices that enable core devices to operate in a safe operating area (SOA), and method for manufacturing the same.

In the field of semiconductor circuits, a core device represents a device to be operated in a lower voltage, for example, around 0.75 volt (V). Alternatively, an input/output (IO) device represents a device to be operated in a higher voltage, for example, around 1.2V. In general, an IO device usually has a thicker oxide structure and thus has a better SOA. However, an IO device usually has a lower performance in terms of operating speed, driving capability, etc. On the other hand, a core device usually has better performance in terms of operating speed and driving capability, but may not be operated in the same operating voltage as the IO device. As a result, the applications of core devices are limited.

As technology progresses, there are increasing demands on the operating speed of semiconductor devices. For this reason, research has been carried out with respect to core devices being operated in the same voltage as IO devices.

BRIEF DESCRIPTION OF THE DRAWINGS

Aspects of the embodiments of the present disclosure are best understood from the following detailed description when read with the accompanying figures. It should be noted that, in accordance with the standard practice in the industry, various structures are not drawn to scale. In fact, the dimensions of the various structures may be arbitrarily increased or reduced for clarity of discussion.

DETAILED DESCRIPTION

Figure 1A:
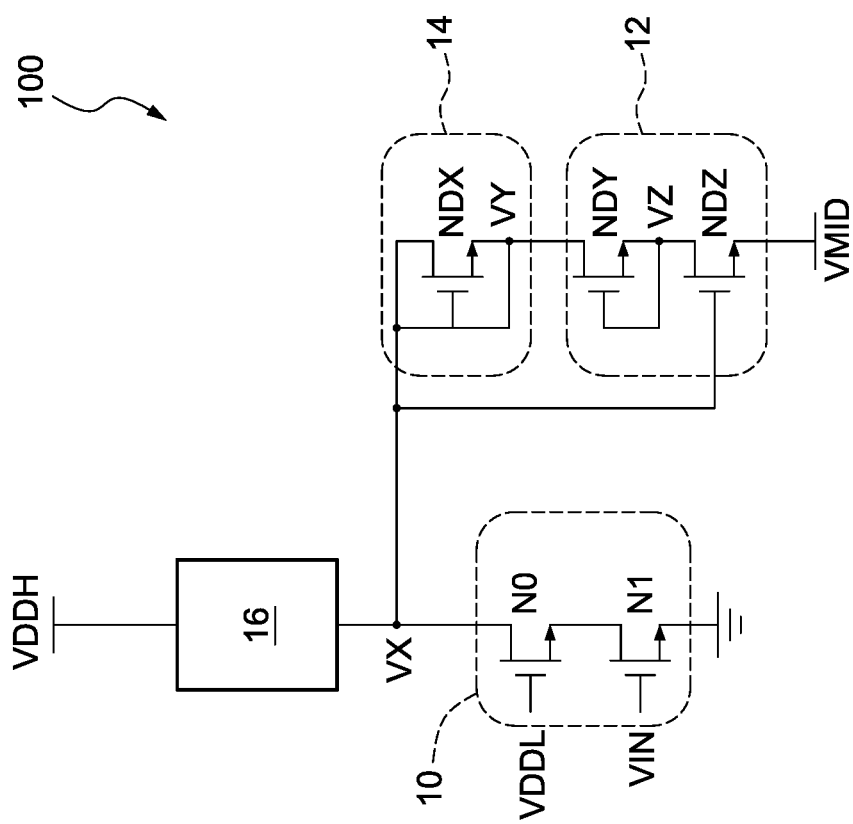
FIG. 1A illustrates a schematic view of a semiconductor device, in accordance with some embodiments of the present disclosure.

The following disclosure provides many different embodiments, or examples, for implementing different features of the provided subject matter. Specific examples of elements and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "upper," "on" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, although terms such as "first," "second" and "third" describe various elements, components, regions, layers and/or sections, these elements, components, regions, layers and/or sections should not be limited by these terms. These terms may only be used to distinguish one element, component, region, layer or section from another. Terms such as "first," "second" and "third" when used herein do not imply a sequence or order unless clearly indicated by the context.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the terms "substantially," "approximately" and "about" generally mean within a value or range that can be contemplated by people having ordinary skill in the art. Alternatively, the terms "substantially," "approximately" and "about" mean within an acceptable standard error of the mean when considered by one of ordinary skill in the art. People having ordinary skill in the art can understand that the acceptable standard error may vary according to different technologies. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the terms "substantially," "approximately" or "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Techniques disclosed in the present disclosure provide numerous solutions, for a core device applied with a voltage range of IO devices, to be able to operate in SOA.

FIG. 1A illustrates a schematic view of a semiconductor device, in accordance with some embodiments of the present disclosure.

FIG. 1A shows a device 100. The device 100 can be an electrical device. The device 100 can be a semiconductor device. The device 100 can be a system of integrated circuits (IC). The device 100 includes a core device 10, a dummy device 12, a dummy device 14, and a circuit 16.

The core device 10 is electrically connected between the circuit 16 and the ground (GND). The circuit 16 is configured to receive a supply voltage VDDH. The circuit 16 is electrically connected to the node VX. The dummy device 12 is electrically connected to the node VX. The dummy device 12 is electrically connected between the core device 10 and a reference voltage VMID. The dummy device 14 is electrically connected to the node VX. The dummy device 14 is electrically connected to the dummy device 12.

The core device 10 includes a transistor N0 and a transistor N1. The transistor N0 can be referred to as a core transistor. The transistor N1 can be referred to as a core transistor. The transistor N0 can be an n-channel MOSFET. The transistor N1 can be an n-channel MOSFET.

A core device represents a device to be operated in a voltage lower than that of an IO device. In some embodiments, a core device can be operated in, for example, around 0.75 V, while an IO device can be operated in, for example, around 1.2 V. The core transistor mentioned in the present disclosure can be a transistor that constitutes a portion of a core device. A core transistor can be applied with a lower voltage, for example, around 0.75 V, while a transistor of an IO device can be applied with a higher voltage, for example, around 1.2 V.

The source of the transistor N0 is electrically connected to the drain of the transistor N1. The drain of the transistor N0 is electrically connected to the circuit 16 at the node VX. The gate of the transistor N0 is configured to receive a reference voltage VDDL. The source of the transistor N1 is electrically connected to the ground (GND). The gate of the transistor N1 is configured to receive an input voltage VIN.

The dummy device 12 includes a transistor NDY and a transistor NDZ. The transistor NDY can be an n-channel MOSFET. The transistor NDZ can be an n-channel MOSFET. The source of the transistor NDY is electrically connected to the drain of the transistor NDZ at the node VZ. The source of the transistor NDY is connected to the gate of the transistor NDY. The gate of the transistor NDZ is electrically connected to the node VX. The source of the transistor NDZ is configured to receive a reference voltage VMID.

In some embodiments, the transistor NDY and the transistor N0 can be transistors of different types. In some embodiments, the transistor NDY and the transistor N0 can include different types of threshold voltages. In some embodiments, the transistor NDY can include a standard threshold voltage, while the transistor N0 can include an ultra low leakage threshold voltage, or vice versa.

In some embodiments, the transistor NDY and the transistor NDZ can be transistors of different types. In some embodiments, the transistor NDY and the transistor NDZ can include different types of threshold voltages. In some embodiments, the transistor NDY can include a standard threshold voltage, while the transistor NDZ can include an ultra low leakage threshold voltage, or vice versa.

The dummy device 14 includes a transistor NDX. The transistor NDX can be an n-channel MOSFET. The gate, the source and the drain of the transistor NDX are connected together. The gate, the source and the drain of the transistor NDX are electrically connected to the node VX. The gate, the source and the drain of the transistor NDX are electrically connected to the drain of the transistor NDY at the node VY.

For semiconductor devices (such as BJT, MOSFET, thyristor or IGBT), the safe operating area (SOA) is referred to as the voltage and current conditions over which the device can be expected to operate without self-damage. In some embodiments, for a MOSFET, the safe operating area (SOA) can be a condition wherein the voltages VGS, VDS and VGD of a transistor do not exceed a predetermined voltage. In some embodiments, the safe operating area (SOA) can be a condition wherein the voltages VGS, VDS and VGD of a transistor are lower than 0.96 V.

The operations of the device 100 will be described as follows. In some embodiments, the supply voltage VDDH can be approximately 1.2 V. In some embodiments, the reference voltage VDDL can be approximately 0.75 V. In some embodiments, the reference voltage VMID can be approximately 0.75 V. In some embodiments, the input voltage VIN of the transistor N1 can range approximately from 0 V to 0.75 V. In some embodiments, the reference voltage VDDL can be identical to the reference voltage VMID. In some embodiments, the reference voltage VDDL can be different from the reference voltage VMID. The input voltage VIN of the transistor N1 can control the transistor N1 to be on or off.

In the condition wherein the transistor N1 is turned on, the current flow driven by the transistor N1 will pull low the voltage at the node VX, and thus the transistor NDZ will be turned off. At the same time, the transistor NDY is off since there is no voltage difference between the gate and the source of the transistor NDY, and the transistor NDX is off for the same reason. Since the transistors NDX, NDY and NDZ are all off, the dummy device 12 and the dummy device 14 will merely consume very limited current, for example, leakage current, when the transistor N1 is turned on. In addition, the transistors N0, N1, NDX, NDY, NDZ will all be in SOA.

When the transistor N1 is turned on, the voltage applied to the gate of the transistor N1 can be 0.75 V. For the transistor N0, the reference voltage VDDL of around 0.75 V can applied to the gate of the transistor N0, and due to its inherent source-following circuit operation, the voltage at the source of the transistor N0 will track the voltage VDDL. That is, the voltage at the source of the transistor N0 will not exceed the voltage VDDL. Therefore, the VGS, VDS and VGD of the transistor N1 will all be lower than a predetermined voltage, for example, 0.96 V. Additionally, the VGS, VDS and VGD of the transistor N0 will all be lower than a predetermined voltage, for example, 0.96 V.

In the condition wherein the transistor N1 is turned off, the voltage at the node VX will be pulled up to nearly identical to the supply voltage VDDH. At this time, the transistor NDZ will be turned on and then pass the reference voltage VMID to the gate/source of the transistor NDY. The transistor NDY is off since the VGS of the transistor NDY is zero. The transistor NDX is off since the VGS of the transistor NDY is zero. Both the transistor NDY and the transistor NDZ will be in SOA. In addition, the transistors N0, N1 and NDX will all be in SOA.

When the transistor N1 is turned off, the voltage applied to the gate of the transistor N1 can be 0 V. For the transistor N0, the reference voltage VDDL of around 0.75 V can be applied to the gate of the transistor N0, and due to its inherent source-following circuit operation, the voltage at the source of the transistor N0 will track the voltage VDDL. That is, the voltage at the source of the transistor N0 will not exceed the voltage VDDL. Therefore, the VGS, VDS and VGD of the transistor N1 will all be lower than a predetermined voltage, for example, 0.96 V. Additionally, the VGS, VDS and VGD of the transistor N0 will all be lower than a predetermined voltage, for example, 0.96 V.

It should be noted that, when the transistor N1 is turned off, the node VX will be pulled up to supply voltage VDDH (for example, 1.2 V). That is, during the operations of the device 100, the core device 10 can be applied with a voltage in the range of IO voltage. In some embodiments, the IO voltage mentioned in the present disclosure can be greater than or equal to approximately 1.2 V. In some embodiments, the IO voltage mentioned in the present disclosure can be greater than or equal to approximately 1.8 V. As discussed in the previous paragraph, the configurations of the dummy device 12 enable that the transistors N0 and N1 of the core device 10 to be operated in SOA. In addition, all the transistors in the dummy device 12 and the dummy device 14 will be operated in SOA.

For the dummy devices 12 and 14 that include n-channel MOSFETs, the reference voltage VMID can be defined by the following equation:

$$VX(max) - VMID < SOA \text{ limit for VGS/VDS/VGD} \quad \text{(equation 1)}$$

The VX(max) represents the maximum value of the voltage at the node VX. For example, if the supply voltage VDDH applied to the device 100 is 1.2V, then the VX(max) is 1.2 V.

Figure 1B:
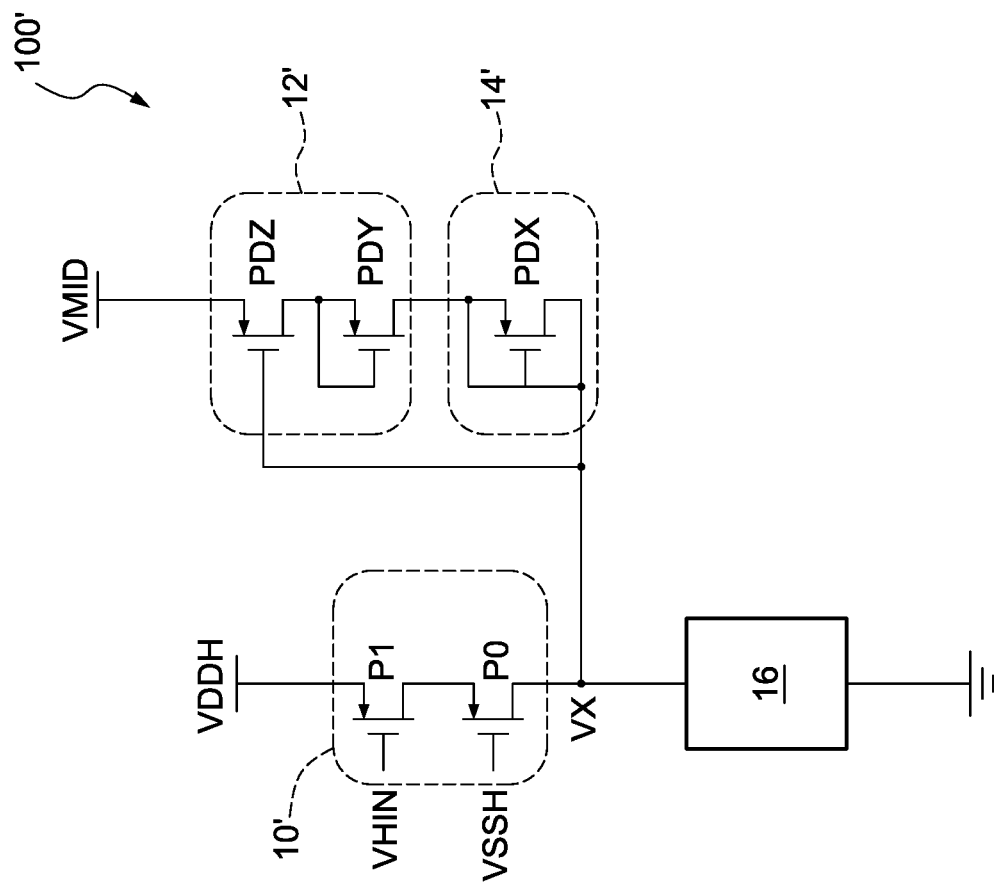
FIG. 1B illustrates a schematic view of a semiconductor device, in accordance with some embodiments of the present disclosure.

FIG. 1B illustrates a schematic view of a semiconductor device, in accordance with some embodiments of the present disclosure.

FIG. 1B shows a device 100'. The device 100' can be an electrical device. The device 100' can be a semiconductor device. The device 100' can be a system of integrated circuits (IC). The device 100' includes a core device 10', a dummy device 12', a dummy device 14', and a circuit 16.

The core device 10' is electrically connected between the circuit 16 and a supply voltage VDDH. The circuit 16 is electrically connected between the core device 10' and the ground (GND). The core device 10' and the circuit 16 are electrically connected at the node VX. The dummy device 12' is electrically connected to the node VX. The dummy device 12' is electrically connected between the core device 10' and a reference voltage VMID. The dummy device 14' is electrically connected to the node VX. The dummy device 14' is electrically connected to the dummy device 12'.

The core device 10' includes a transistor P0 and a transistor P1. The transistor P0 can be referred to as a core transistor. The transistor P1 can be referred to as a core transistor. The transistor P0 can be a p-channel MOSFET. The transistor N1 can be a p-channel MOSFET. The core transistor mentioned in the present disclosure can be a transistor that constitutes a portion of a core device.

The source of the transistor P0 is electrically connected to the drain of the transistor P1. The drain of the transistor P0 is electrically connected to the circuit 16 at the node VX. The gate of the transistor P0 is configured to receive a reference voltage VSSH. The source of the transistor P1 is electrically connected to the supply voltage VDDH. The gate of the transistor P1 is configured to receive an input voltage VHIN.

The dummy device 12' includes a transistor PDY and a transistor PDZ. The transistor PDY can be a p-channel MOSFET. The transistor PDZ can be a p-channel MOSFET. The source of the transistor PDY is electrically connected to the drain of the transistor PDZ. The source of the transistor PDY is connected to the gate of the transistor PDY. The gate of the transistor PDZ is electrically connected to the node VX. The source of the transistor PDZ is configured to receive a reference voltage VMID.

In some embodiments, the transistor PDY and the transistor P0 can be transistors of different types. In some embodiments, the transistor PDY and the transistor P0 can include different types of threshold voltages. In some embodiments, the transistor PDY can include a standard threshold voltage, while the transistor P0 can include an ultra low leakage threshold voltage, or vice versa.

In some embodiments, the transistor PDY and the transistor PDZ can be transistors of different types. In some embodiments, the transistor PDY and the transistor PDZ can include different types of threshold voltages. In some embodiments, the transistor PDY can include a standard threshold voltage, while the transistor PDZ can include an ultra low leakage threshold voltage, or vice versa.

The dummy device 14' includes a transistor PDX. The transistor PDX can be a p-channel MOSFET. The gate, the source and the drain of the transistor PDX are connected together. The gate, the source and the drain of the transistor PDX are electrically connected to the node VX.

The operations of the device 100' are similar to those of the device 100. In some embodiments, the supply voltage VDDH can be approximately 1.2 V. In some embodiments, the reference voltage VSSH can be approximately 0.45 V. In some embodiments, the reference voltage VMID can be approximately 0.45 V. In some embodiments, the reference voltage VSSH can be different from the reference voltage VMID. In some embodiments, the input voltage VHIN of the transistor P1 can range approximately from 0.45 V to 1.2 V. The input voltage VHIN of the transistor P1 can control the transistor P1 to be on or off.

In the condition wherein the transistor P1 is turned on, the current flow driven by the transistor P1 will pull up the voltage at the node VX, and thus the transistor PDZ will be turned off. At the same time, the transistor PDY is off since there is no voltage difference between the gate and the source of the transistor PDY, and the transistor PDX is off for the same reason. Since the transistors PDX, PDY and PDZ are all off, the dummy device 12' and the dummy device 14' will merely consume very limited current, for example, leakage current, when the transistor P1 is turned on. In addition, since the VGS, VDS and VGD of the transistors P0, P1, PDX, PDY, PDZ will all be lower than a predetermined voltage (for example, 0.96 V), the transistors P0, P1, PDX, PDY, PDZ will all be in SOA.

In the condition wherein the transistor P1 is turned off, the voltage at the node VX will be pulled low to nearly identical to the ground (GND). At this time, the transistor PDZ will be turned on and then pass the reference voltage VMID to the gate/source of the transistor PDY. The transistor PDY is off since the VGS of the transistor NDY is zero. The transistor PDX is off since the VGS of the transistor NDY is zero. In addition, since the VGS, VDS and VGD of the transistors P0, P1, PDX, PDY and PDZ will all be lower than a predetermined voltage (for example, 0.96 V), the transistors P0, P1, PDX, PDY and PDZ will all be in SOA.

It should be noted that, when the transistor P1 is turned on, the node VX will be pulled up to supply voltage VDDH (for example, 1.2 V). That is, during the operations of the device 100', the core device 10' can be applied with a voltage in the range of IO voltage. As discussed in the previous paragraph, the configurations of the dummy device 12' enable that the transistors P0 and P1 of the core device 10' to be operated in SOA. In addition, all the transistors in the dummy device 12' and the dummy device 14' will be operated in SOA.

For the dummy devices 12' and 14' that include p-channel MOSFETs, the reference voltage VMID can be defined by the following equation:

$$\text{VMID} < \text{SOA limit for VGS/VDS/VGD} \quad \text{(equation 2)}$$

Figure 2A:
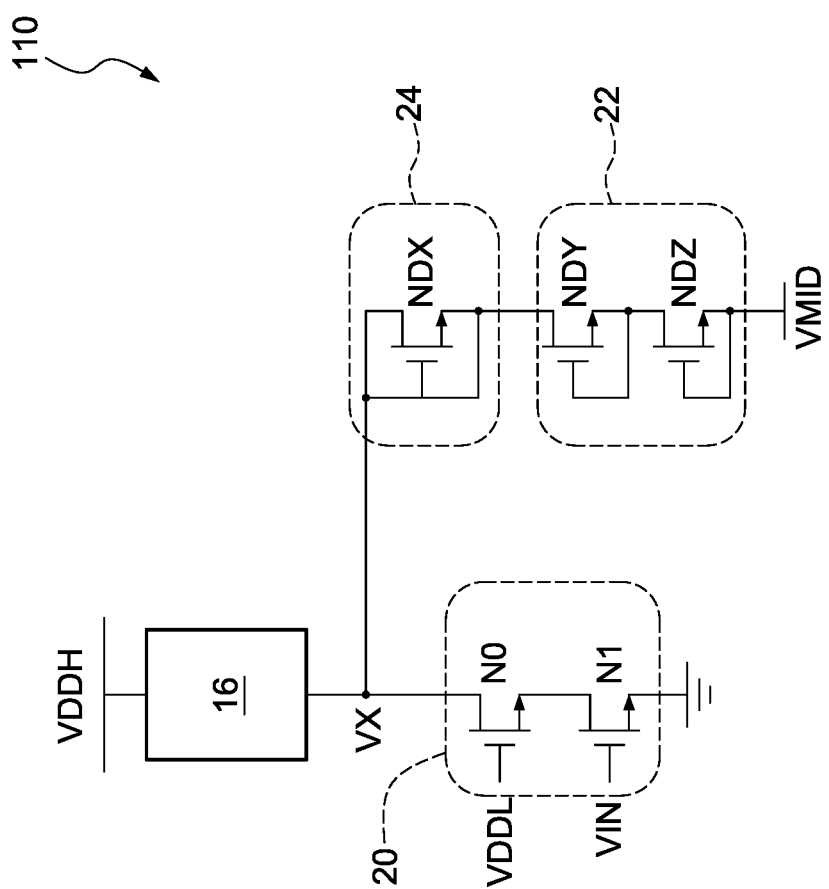
FIG. 2A illustrates a schematic view of a semiconductor device, in accordance with some embodiments of the present disclosure.

FIG. 2A illustrates a schematic view of a semiconductor device, in accordance with some embodiments of the present disclosure.

FIG. 2A shows a device 110. The device 110 can be an electrical device. The device 110 can be a semiconductor device. The device 110 can be a system of integrated circuits (IC). The device 110 includes a core device 20, a dummy device 22, a dummy device 24, and a circuit 16.

The core device 20 is electrically connected between the circuit 16 and the ground (GND). The circuit 16 is configured to receive a supply voltage VDDH. The circuit 16 is electrically connected to the node VX. The dummy device 24 is electrically connected to the node VX. The dummy device 24 is electrically connected to the dummy device 22. The dummy device 22 is electrically connected between the dummy device 24 and a reference voltage VMID.

The core device 20 includes a transistor N0 and a transistor N1. The transistor N0 can be referred to as a core transistor. The transistor N1 can be referred to as a core transistor. The transistor N0 can be an n-channel MOSFET. The transistor N1 can be an n-channel MOSFET. The core transistor mentioned in the present disclosure can be a transistor that constitutes a portion of a core device.

The source of the transistor N0 is electrically connected to the drain of the transistor N1. The drain of the transistor N0 is electrically connected to the circuit 16 at the node VX. The gate of the transistor N0 is configured to receive a reference voltage VDDL. The source of the transistor N1 is electrically connected to the ground (GND). The gate of the transistor N1 is configured to receive an input voltage VIN.

The dummy device 22 includes a transistor NDY and a transistor NDZ. The transistor NDY can be an n-channel MOSFET. The transistor NDZ can be an n-channel MOSFET. The source of the transistor NDY is electrically connected to the drain of the transistor NDZ. The source of the transistor NDY is connected to the gate of the transistor NDY. The gate of the transistor NDZ is electrically connected to the source of the transistor NDZ. The source of the transistor NDZ is configured to receive a reference voltage VMID.

The dummy device 24 includes a transistor NDX. The transistor NDX can be an n-channel MOSFET. The gate, the source and the drain of the transistor NDX are connected together. The gate, the source and the drain of the transistor NDX are electrically connected to the node VX. The gate, the source and the drain of the transistor NDX are electrically connected to the drain of the transistor NDY.

The operations of the device 110 will be described as follows. In some embodiments, the supply voltage VDDH can be approximately 1.2 V. In some embodiments, the reference voltage VDDL can be approximately 0.75 V. In some embodiments, the reference voltage VMID can be approximately 0.75 V. In some embodiments, the reference voltage VDDL can be identical to the reference voltage VMID. In some embodiments, the reference voltage VDDL can be different from the reference voltage VMID. In some embodiments, the input voltage VIN of the transistor N1 can range approximately from 0 V to 0.75 V. The input voltage VIN of the transistor N1 can control the transistor N1 to be on or off.

In the condition wherein the transistor N1 is turned on, the current flow driven by the transistor N1 will pull low the voltage at the node VX. At the same time, the transistors NDX, NDY and NDZ will all be in the off state since there is no voltage difference between their gates and the sources. Since the transistors NDX, NDY and NDZ are all off, the dummy device 22 and the dummy device 24 will merely consume very limited current, for example, leakage current, when the transistor N1 is turned on. In addition, the transistors N0, N1, NDX, NDY, NDZ will all be in SOA.

In the condition wherein the transistor N1 is turned off, the voltage at the node VX will be pulled up to nearly identical to the supply voltage VDDH. At this time, the transistors NDX, NDY and NDZ will all be in the off state since there is no voltage difference between their gates and the sources. Both the transistor NDY and the transistor NDZ will be in SOA. In addition, the transistors N0, N1 and NDX will all be in SOA.

For the dummy devices 22 and 24 that include n-channel MOSFETs, the reference voltage VMID can be defined by the equation 1.

Figure 2B:
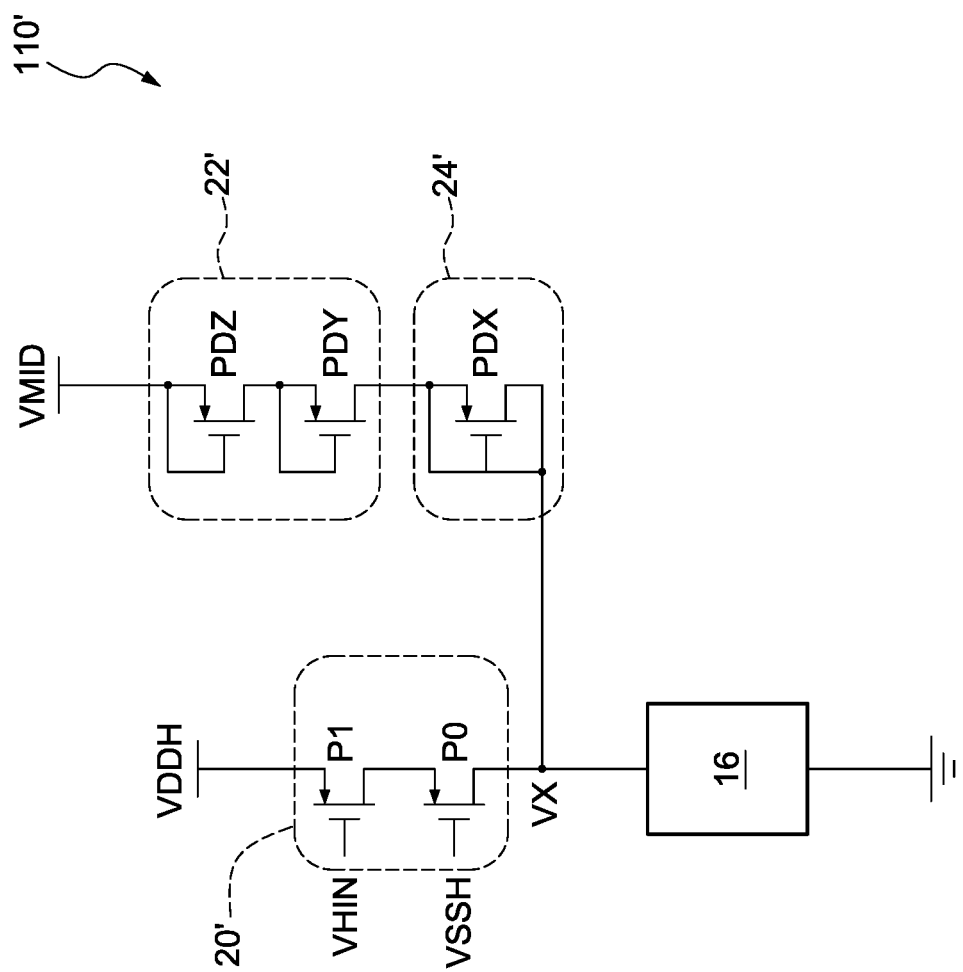
FIG. 2B illustrates a schematic view of a semiconductor device, in accordance with some embodiments of the present disclosure.

FIG. 2B illustrates a schematic view of a semiconductor device, in accordance with some embodiments of the present disclosure.

FIG. 2B shows a device 110'. The device 110' can be an electrical device. The device 110' can be a semiconductor device. The device 110' can be a system of integrated circuits (IC). The device 110' includes a core device 20', a dummy device 22', a dummy device 24', and a circuit 16.

The core device 20' is electrically connected between the circuit 16 and a supply voltage VDDH. The circuit 16 is electrically connected between the core device 20' and the ground (GND). The core device 20' and the circuit 16 are electrically connected at the node VX. The dummy device 24' is electrically connected to the node VX. The dummy device 24' is electrically connected to the dummy device 22'. The dummy device 22' is electrically connected between the core device 20' and a reference voltage VMID.

The core device 20' includes a transistor P0 and a transistor P1. The transistor P0 can be referred to as a core transistor. The transistor P1 can be referred to as a core transistor. The transistor P0 can be a p-channel MOSFET. The transistor N1 can be a p-channel MOSFET. The core transistor mentioned in the present disclosure can be a transistor that constitutes a portion of a core device.

The source of the transistor P0 is electrically connected to the drain of the transistor P1. The drain of the transistor P0 is electrically connected to the circuit 16 at the node VX. The gate of the transistor P0 is configured to receive a reference voltage VSSH. The source of the transistor P1 is electrically connected to the supply voltage VDDH. The gate of the transistor P1 is configured to receive an input voltage VHIN.

The dummy device 22' includes a transistor PDY and a transistor PDZ. The transistor PDY can be a p-channel MOSFET. The transistor PDZ can be a p-channel MOSFET. The source of the transistor PDY is electrically connected to the drain of the transistor PDZ. The source of the transistor PDY is connected to the gate of the transistor PDY. The source of the transistor PDZ is connected to the gate of the transistor PDZ. The source of the transistor PDZ is configured to receive a reference voltage VMID.

The dummy device 24' includes a transistor PDX. The transistor PDX can be a p-channel MOSFET. The gate, the source and the drain of the transistor PDX are connected together. The gate, the source and the drain of the transistor PDX are electrically connected to the node VX.

The operations of the device 110' are similar to those of the device 110. In some embodiments, the supply voltage VDDH can be approximately 1.2 V. In some embodiments, the reference voltage VSSH can be approximately 0.45 V. In some embodiments, the reference voltage VMID can be approximately 0.45 V. In some embodiments, the reference voltage VSSH can be different from the reference voltage VMID. In some embodiments, the input voltage VHIN of the transistor P1 can range approximately from 0.45 V to 1.2 V. The input voltage VHIN of the transistor P1 can control the transistor P1 to be on or off.

In the condition wherein the transistor P1 is turned on, the current flow driven by the transistor P1 will pull up the voltage at the node VX. At the same time, the transistors PDX, PDY and PDZ will all be in the off state since there is no voltage difference between their gates and the sources. Since the transistors PDX, PDY and PDZ are all off, the dummy device 22' and the dummy device 24' will merely consume very limited current, for example, leakage current, when the transistor P1 is turned on. In addition, since the VGS, VDS and VGD of the transistors P0, P1, PDX, PDY, PDZ will all be lower than a predetermined voltage (for example, 0.96 V), the transistors P0, P1, PDX, PDY, PDZ will all be in SOA.

In the condition wherein the transistor P1 is turned off, the voltage at the node VX will be pulled low to nearly identical to the ground (GND). At this time, the transistors PDX, PDY and PDZ will all be in the off state since there is no voltage difference between their gates and the sources. Both the transistor PDY and the transistor PDZ will be in SOA. In addition, the transistors P0, P1 and PDX will all be in SOA.

For the dummy devices 22' and 24' that include p-channel MOSFETs, the reference voltage VMID can be defined by the equation 2.

Figure 3A:
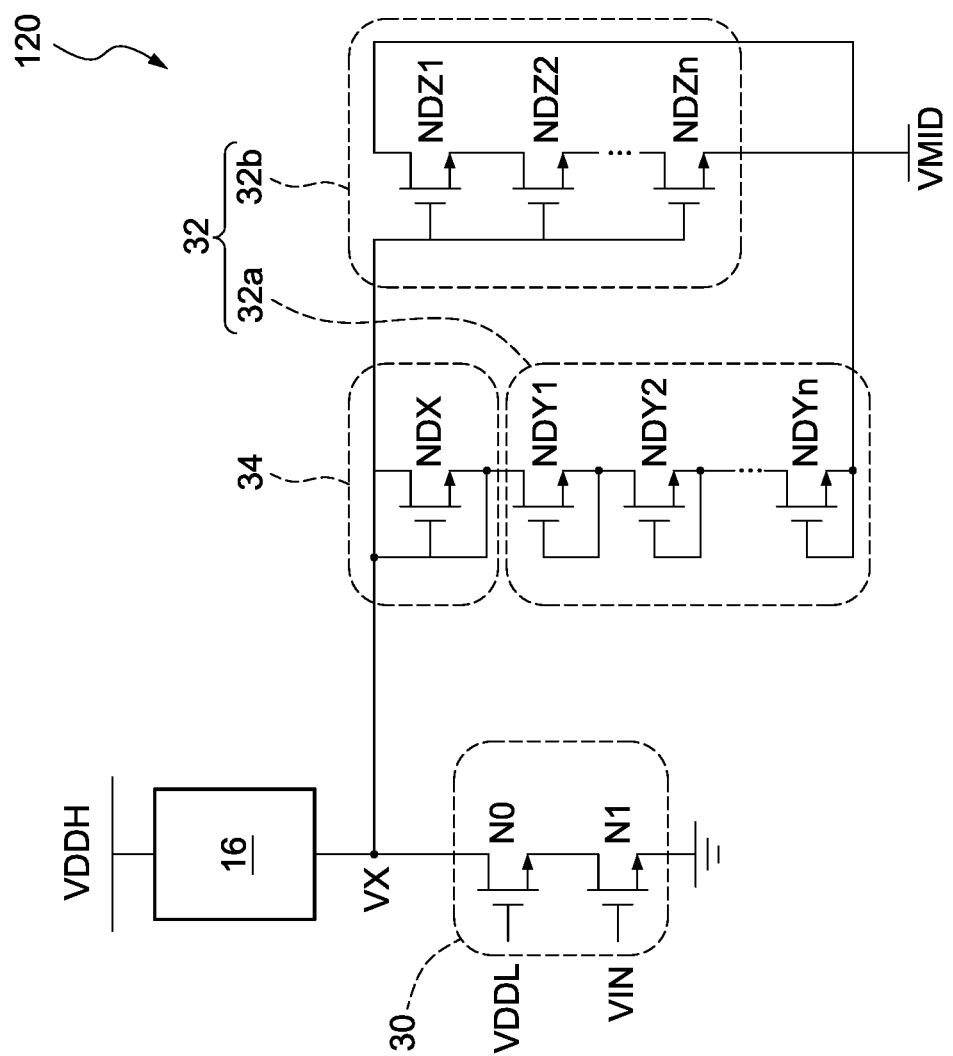
FIG. 3A illustrates a schematic view of a semiconductor device, in accordance with some embodiments of the present disclosure.

FIG. 3A illustrates a schematic view of a semiconductor device, in accordance with some embodiments of the present disclosure.

FIG. 3A shows a device 120. The device 120 can be an electrical device. The device 120 can be a semiconductor device. The device 120 can be a system of integrated circuits (IC). The device 120 includes a core device 30, a dummy device 32, a dummy device 34, and a circuit 16. The dummy device 32 includes dummy circuits 32a and 32b.

The core device 30 is electrically connected between the circuit 16 and the ground (GND). The circuit 16 is configured to receive a supply voltage VDDH. The circuit 16 is electrically connected to the node VX. The dummy device 32 is electrically connected to the node VX. The dummy device 32 is electrically connected between the core device 30 and a reference voltage VMID. The dummy device 34 is electrically connected to the node VX. The dummy device 34 is electrically connected to the dummy device 32.

The dummy circuit 32a is electrically connected between the dummy device 34 and the dummy circuit 32b. The dummy circuit 32b is electrically connected to the dummy device 34. The dummy circuit 32b is electrically connected between the reference voltage VMID and the node VX.

The core device 30 includes a transistor N0 and a transistor N1. The transistor N0 can be referred to as a core transistor. The transistor N1 can be referred to as a core transistor. The transistor N0 can be an n-channel MOSFET. The transistor N1 can be an n-channel MOSFET. The core transistor mentioned in the present disclosure can be a transistor that constitutes a portion of a core device.

The source of the transistor N0 is electrically connected to the drain of the transistor N1. The drain of the transistor N0 is electrically connected to the circuit 16 at the node VX. The gate of the transistor N0 is configured to receive a reference voltage VDDL. The source of the transistor N1 is electrically connected to the ground (GND). The gate of the transistor N1 is configured to receive an input voltage VIN.

The dummy circuit 32a includes a plurality of transistors NDY1, NDY2, NDY3, . . . and NDYn. The number "n" is a positive integer. Each of the transistors NDY1, NDY2, NDY3, . . . and NDYn can be an n-channel MOSFET.

The source and the gate of the transistor NDY1 are connected together. The source of the transistor NDY1 is electrically connected to the drain of the transistor NDY2. The transistors NDY2, NDY3, . . . and NDYn all include the same configuration as the transistor NDY1. The source of the transistor NDYn is electrically connected to the dummy circuit 32b. The source of the transistor NDYn is electrically connected to the drain of the transistor NDZ1.

The dummy circuit 32b includes a plurality of transistors NDZ1, NDZ2, NDZ3, . . . and NDZn. The number "n" is a positive integer. Each of the transistors NDZ1, NDZ2, NDZ3, . . . and NDZn can be an n-channel MOSFET. The source of the transistor NDZ1 is electrically connected to the drain of the transistor NDZ2. The transistors NDZ2, NDZ3, . . . and NDZn all include the same configuration as the transistor NDZ1. The gates of the transistors NDZ1, NDZ2, NDZ3, . . . and NDZn are all connected to the node VX. The transistors NDZ1, NDZ2, NDZ3, . . . and NDZn can be connected in series, with their gates shared.

The dummy device 34 includes a transistor NDX. The transistor NDX can be an n-channel MOSFET. The gate, the source and the drain of the transistor NDX are connected together. The gate, the source and the drain of the transistor NDX are electrically connected to the node VX.

The operations of the device 120 are similar to those of the device 100. In some embodiments, the supply voltage VDDH can be approximately 1.2 V. In some embodiments, the reference voltage VDDL can be approximately 0.75 V. In some embodiments, the reference voltage VMID can be approximately 0.75 V. In some embodiments, the reference voltage VDDL can be identical to the reference voltage VMID. In some embodiments, the reference voltage VDDL can be different from the reference voltage VMID. In some embodiments, the input voltage VIN of the transistor N1 can range approximately from 0 V to 0.75 V. The input voltage VIN of the transistor N1 can control the transistor N1 to be on or off.

In the condition wherein the transistor N1 is turned on, the current flow driven by the transistor N1 will pull low the voltage at the node VX. At the same time, the transistors NDX, NDY1 to NDYn, and NDZ1 to NDZn will all be in the off state since there is no voltage difference between their gates and the sources. Therefore, the dummy device 32 and the dummy device 34 will merely consume very limited current, for example, leakage current, when the transistor N1 is turned on. In addition, all the transistors of the core device 30, the dummy device 32 and the dummy device 34 will be in SOA.

It should be noted that the transistors NDY1, NDY2, NDY3, . . . and NDYn connected in series will facilitate a decrease of the leakage current, and the transistors NDZ1, NDZ2, NDZ3, . . . and NDZn connected in series will also facilitate a decrease of the leakage current. As a result, the dummy device 32 of FIG. 3A will exhibit a smaller leakage current compared to the dummy device 12 shown in FIG. 1A.

In the condition wherein the transistor N1 is turned off, the voltage at the node VX will be pulled up to nearly identical to the supply voltage VDDH. At this time, the transistors NDX, NDY1 to NDYn, and NDZ1 to NDZn will all be in the off state since there is no voltage difference between their gates and the sources. In addition, all the transistors of the core device 30, the dummy device 32 and the dummy device 34 will be in SOA.

For the dummy devices 32 and 34 that include n-channel MOSFETs, the reference voltage VMID can be defined by the equation 1.

Figure 3B:
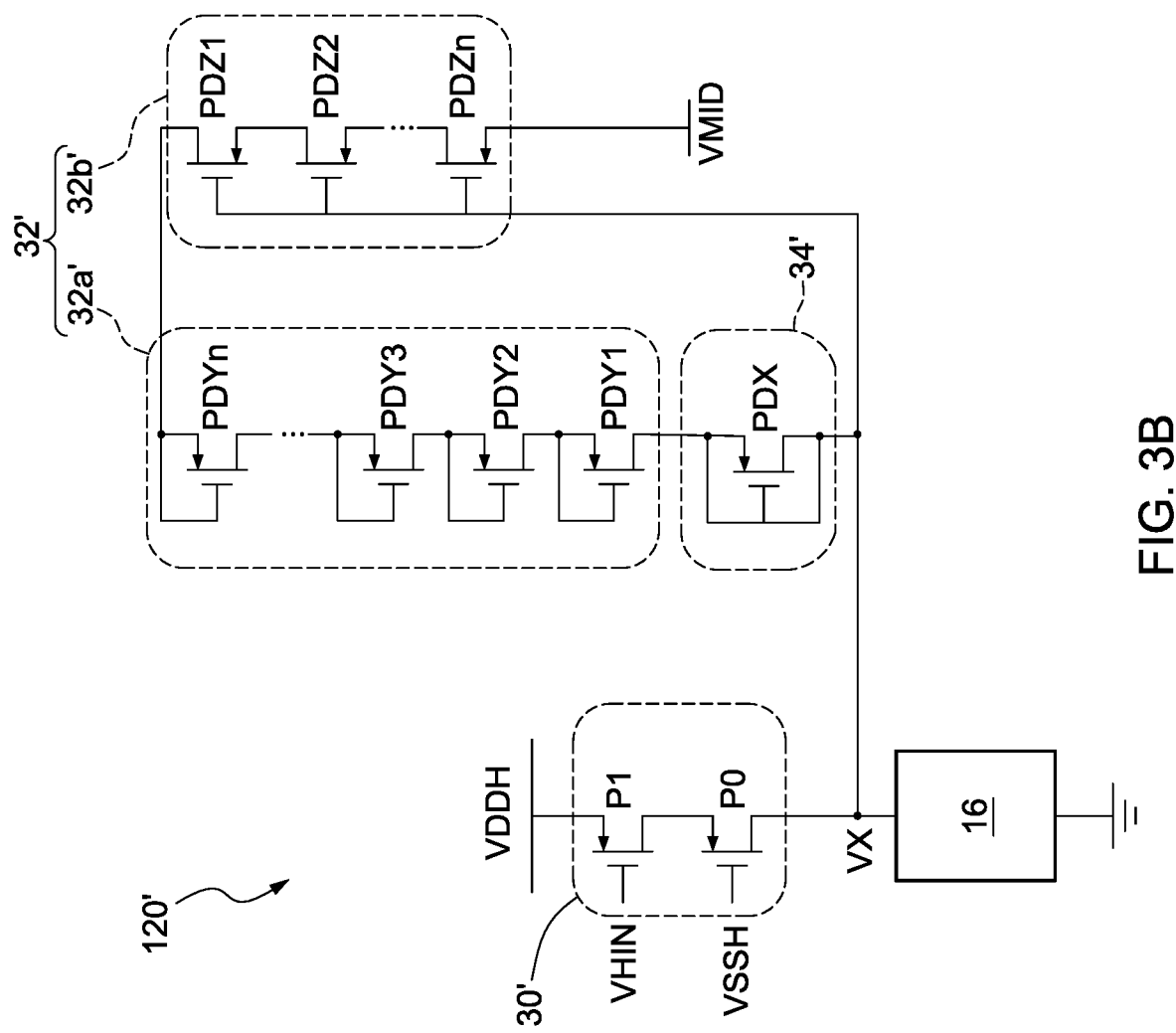
FIG. 3B illustrates a schematic view of a semiconductor device, in accordance with some embodiments of the present disclosure.

FIG. 3B illustrates a schematic view of a semiconductor device, in accordance with some embodiments of the present disclosure.

FIG. 3B shows a device 120'. The device 120' can be an electrical device. The device 120' can be a semiconductor device. The device 120' can be a system of integrated circuits (IC). The device 120' includes a core device 30', a dummy device 32', a dummy device 34', and a circuit 16. The dummy device 32' includes dummy circuits 32a' and 32b'.

The core device 30' is electrically connected between the circuit 16 and a supply voltage VDDH. The circuit 16 is electrically connected between the ground (GND) and the node VX. The dummy device 32' is electrically connected to the node VX. The dummy device 32' is electrically connected between the core device 30 and a reference voltage VMID. The dummy device 34' is electrically connected to the node VX. The dummy device 34' is electrically connected to the dummy device 32'.

The dummy circuit 32a' is electrically connected between the dummy device 34' and the dummy circuit 32b'. The dummy circuit 32b' is electrically connected to the dummy device 34'. The dummy circuit 32b' is electrically connected between the reference voltage VMID and the node VX.

The core device 30' includes a transistor P0 and a transistor P1. The transistor P0 can be referred to as a core transistor. The transistor P1 can be referred to as a core transistor. The transistor P0 can be a p-channel MOSFET. The transistor P1 can be a p-channel MOSFET. The core transistor mentioned in the present disclosure can be a transistor that constitutes a portion of a core device.

The source of the transistor P0 is electrically connected to the drain of the transistor P1. The drain of the transistor P0 is electrically connected to the circuit 16 at the node VX. The gate of the transistor P0 is configured to receive a reference voltage VSSH. The source of the transistor P1 is electrically connected to the supply voltage VDDH. The gate of the transistor P1 is configured to receive an input voltage VHIN.

The dummy circuit 32a' includes a plurality of transistors PDY1, PDY2, PDY3, . . . and PDYn. The number "n" is a positive integer. Each of the transistors PDY1, PDY2, PDY3, . . . and PDYn can be a p-channel MOSFET.

The source and the gate of the transistor PDY1 are connected together. The source of the transistor PDY1 is electrically connected to the drain of the transistor PDY2. The transistors PDY2, PDY3, . . . and PDYn all include the same configuration as the transistor PDY1. The source of the transistor PDYn is electrically connected to the dummy circuit 32b'. The source of the transistor PDYn is electrically connected to the drain of the transistor PDZ1.

The dummy circuit 32b' includes a plurality of transistors PDZ1, PDZ2, PDZ3, . . . and PDZn. The number "n" is a positive integer. Each of the transistors PDZ1, PDZ2, PDZ3, . . . and PDZn can be a p-channel MOSFET. The source of the transistor PDZ1 is electrically connected to the drain of the transistor PDZ2. The transistors PDZ2, PDZ3, . . . and PDZn all include the same configuration as the transistor PDZ1. The gates of the transistors PDZ1, PDZ2, PDZ3, . . . and PDZn are all connected to the node VX. The transistors PDZ1, PDZ2, PDZ3, . . . and PDZn can be connected in series, with their gates shared.

The dummy device 34' includes a transistor PDX. The transistor PDX can be a p-channel MOSFET. The gate, the source and the drain of the transistor PDX are connected together. The gate, the source and the drain of the transistor PDX are electrically connected to the node VX.

The operations of the device 120' are similar to those of the device 100'. In some embodiments, the supply voltage VDDH can be approximately 1.2 V. In some embodiments, the reference voltage VSSH can be approximately 0.45 V. In some embodiments, the reference voltage VMID can be approximately 0.45 V. In some embodiments, the reference voltage VSSH can be different from the reference voltage VMID. In some embodiments, the input voltage VHIN of the transistor P1 can range approximately from 0.45 V to 1.2

V. The input voltage VHIN of the transistor P1 can control the transistor P1 to be on or off.

In the condition wherein the transistor P1 is turned on, the current flow driven by the transistor P1 will pull up the voltage at the node VX. At the same time, the transistors PDX, PDY1 to PDYn, and PDZ1 to PDZn will all be in the off state since there is no voltage difference between their gates and the sources. Therefore, the dummy device 32' and the dummy device 34' will merely consume very limited current, for example, leakage current, when the transistor P1 is turned on. In addition, all the transistors of the core device 30', the dummy device 32' and the dummy device 34' will be in SOA.

It should be noted that the transistors PDY1, PDY2, PDY3, . . . and PDYn connected in series will facilitate a decrease of the leakage current, and the transistors PDZ1, PDZ2, PDZ3, . . . and PDZn connected in series will also facilitate a decrease of the leakage current. As a result, the dummy device 32' of FIG. 3B will exhibit a smaller leakage current compared to the dummy device 12' shown in FIG. 1B.

In the condition wherein the transistor P1 is turned off, the voltage at the node VX will be pulled low to nearly identical to the ground (GND). At this time, the transistors PDX, PDY1 to PDYn, and PDZ1 to PDZn will all be in the off state since there is no voltage difference between their gates and the sources. In addition, all the transistors of the core device 30', the dummy device 32' and the dummy device 34' will be in SOA.

For the dummy devices 32' and 34' that include p-channel MOSFETs, the reference voltage VMID can be defined by the equation 2.

Figure 4A:
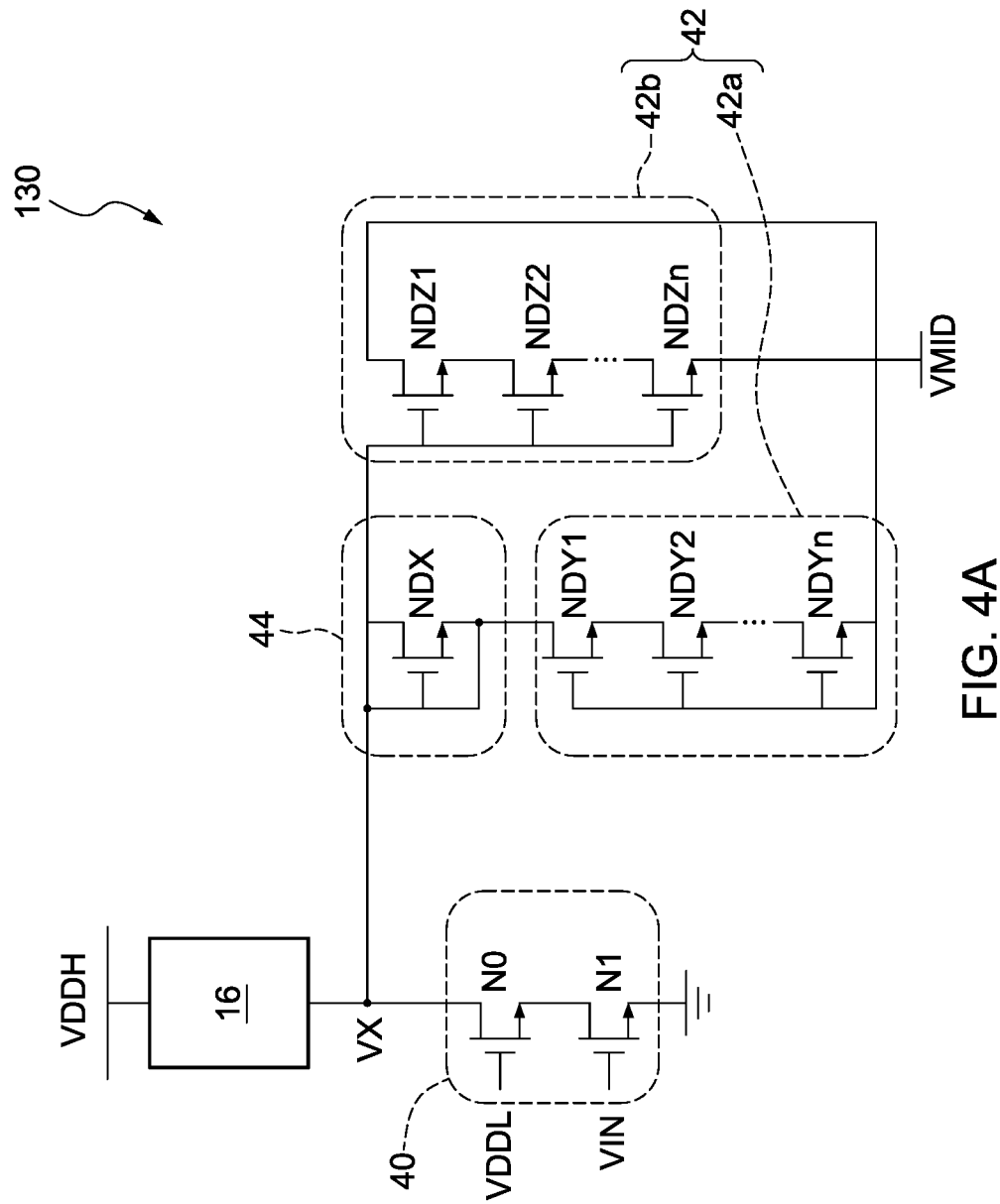
FIG. 4A illustrates a schematic view of a semiconductor device, in accordance with some embodiments of the present disclosure.

FIG. 4A illustrates a schematic view of a semiconductor device, in accordance with some embodiments of the present disclosure.

FIG. 4A shows a device 130. The device 130 can be an electrical device. The device 130 can be a semiconductor device. The device 130 can be a system of integrated circuits (IC). The device 130 includes a core device 40, a dummy device 42, a dummy device 44, and a circuit 16. The dummy device 42 includes dummy circuits 42a and 42b.

The core device 40 is electrically connected between the circuit 16 and the ground (GND). The circuit 16 is configured to receive a supply voltage VDDH. The circuit 16 is electrically connected to the node VX. The dummy device 42 is electrically connected to the node VX. The dummy device 42 is electrically connected between the core device 40 and a reference voltage VMID. The dummy device 44 is electrically connected to the node VX. The dummy device 44 is electrically connected to the dummy device 42.

The dummy circuit 42a is electrically connected between the dummy device 44 and the dummy circuit 42b. The dummy circuit 42b is electrically connected to the dummy device 44. The dummy circuit 42b is electrically connected between the reference voltage VMID and the node VX.

The core device 40 includes a transistor N0 and a transistor N1. The transistor N0 can be referred to as a core transistor. The transistor N1 can be referred to as a core transistor. The transistor N0 can be an n-channel MOSFET. The transistor N1 can be an n-channel MOSFET. The core transistor mentioned in the present disclosure can be a transistor that constitutes a portion of a core device.

The source of the transistor N0 is electrically connected to the drain of the transistor N1. The drain of the transistor N0 is electrically connected to the circuit 16 at the node VX. The gate of the transistor N0 is configured to receive a reference voltage VDDL. The source of the transistor N1 is electrically connected to the ground (GND). The gate of the transistor N1 is configured to receive an input voltage VIN.

The dummy circuit 42a includes a plurality of transistors NDY1, NDY2, NDY3, . . . and NDYn. The number "n" is a positive integer. Each of the transistors NDY1, NDY2, NDY3, . . . and NDYn can be an n-channel MOSFET.

The source of the transistor NDY1 is electrically connected to the drain of the transistor NDY2, and the source of the transistor NDY2 is electrically connected to the drain of the transistor NDY3, and so forth. The gates of the transistors NDY1, NDY2, NDY3, . . . and NDYn are connected together. The transistors NDY1, NDY2, NDY3, . . . and NDYn can be connected in series, with their gates shared. The source and the gate of the transistor NDYn are connected together. The source of the transistor NDYn is electrically connected to the dummy circuit 42b. The source of the transistor NDYn is electrically connected to the drain of the transistor NDZ1.

The dummy circuit 42b includes a plurality of transistors NDZ1, NDZ2, NDZ3, . . . and NDZn. The number "n" is a positive integer. Each of the transistors NDZ1, NDZ2, NDZ3, . . . and NDZn can be an n-channel MOSFET. The source of the transistor NDZ1 is electrically connected to the drain of the transistor NDZ2, and the source of the transistor NDZ2 is electrically connected to the drain of the transistor NDZ3, and so forth. The gates of the transistors NDZ1, NDZ2, NDZ3, . . . and NDZn are all connected to the node VX. The transistors NDZ1, NDZ2, NDZ3, . . . and NDZn can be connected in series, with their gates shared.

The dummy device 34 includes a transistor NDX. The transistor NDX can be an n-channel MOSFET. The gate, the source and the drain of the transistor NDX are connected together. The gate, the source and the drain of the transistor NDX are electrically connected to the node VX.

The operations of the device 130 are similar to those of the device 100. In some embodiments, the supply voltage VDDH can be approximately 1.2 V. In some embodiments, the reference voltage VDDL can be approximately 0.75 V. In some embodiments, the reference voltage VMID can be approximately 0.75 V. In some embodiments, the reference voltage VDDL can be identical to the reference voltage VMID. In some embodiments, the reference voltage VDDL can be different from the reference voltage VMID. In some embodiments, the input voltage VIN of the transistor N1 can range approximately from 0 V to 0.75 V. The input voltage VIN of the transistor N1 can control the transistor N1 to be on or off.

In the condition wherein the transistor N1 is turned on, the current flow driven by the transistor N1 will pull low the voltage at the node VX. At the same time, the transistors NDX, NDY1 to NDYn, and NDZ1 to NDZn will all be in the off state since there is no voltage difference between their gates and the sources. Therefore, the dummy device 42 and the dummy device 44 will merely consume very limited current, for example, leakage current, when the transistor N1 is turned on. In addition, all the transistors of the core device 40, the dummy device 42 and the dummy device 44 will be in SOA.

It should be noted that the transistors NDY1, NDY2, NDY3, . . . and NDYn connected in series will facilitate a decrease of the leakage current, and the transistors NDZ1, NDZ2, NDZ3, . . . and NDZn connected in series will also facilitate a decrease of the leakage current. As a result, the dummy device 42 of FIG. 4A will exhibit a smaller leakage current compared to the dummy device 12 shown in FIG. 1A.

In the condition wherein the transistor N1 is turned off, the voltage at the node VX will be pulled up to nearly identical to the supply voltage VDDH. At this time, the transistors NDX, NDY1 to NDYn, and NDZ1 to NDZn will all be in the off state since there is no voltage difference between their gates and the sources. In addition, all the transistors of the core device 40, the dummy device 42 and the dummy device 44 will be in SOA.

For the dummy devices 42 and 44 that include n-channel MOSFETs, the reference voltage VMID can be defined by the equation 1.

Figure 4B:
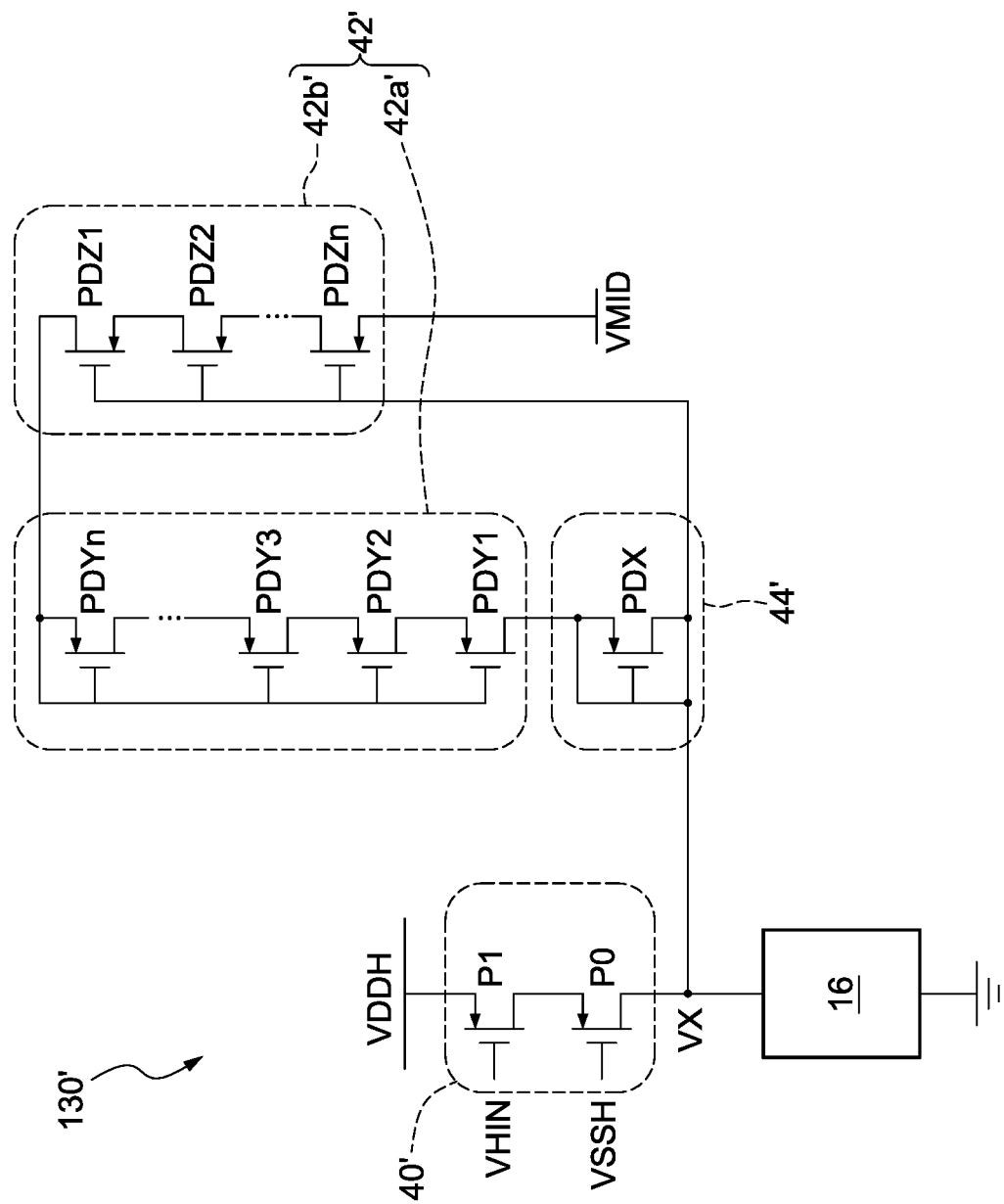
FIG. 4B illustrates a schematic view of a semiconductor device, in accordance with some embodiments of the present disclosure.

FIG. 4B illustrates a schematic view of a semiconductor device, in accordance with some embodiments of the present disclosure.

FIG. 4B shows a device 130'. The device 130' can be an electrical device. The device 130' can be a semiconductor device. The device 130' can be a system of integrated circuits (IC). The device 130' includes a core device 40', a dummy device 42', a dummy device 44', and a circuit 16. The dummy device 42' includes dummy circuits 42a' and 42b'.

The core device 40' is electrically connected between the circuit 16 and a supply voltage VDDH. The circuit 16 is electrically connected between the ground (GND) and the node VX. The dummy device 42' is electrically connected to the node VX. The dummy device 42' is electrically connected between the core device 40 and a reference voltage VMID. The dummy device 44' is electrically connected to the node VX. The dummy device 44' is electrically connected to the dummy device 42'.

The dummy circuit 42a' is electrically connected between the dummy device 44' and the dummy circuit 42b'. The dummy circuit 42b' is electrically connected to the dummy device 44'. The dummy circuit 42b' is electrically connected between the reference voltage VMID and the node VX.

The core device 40' includes a transistor P0 and a transistor P1. The transistor P0 can be referred to as a core transistor. The transistor P1 can be referred to as a core transistor. The transistor P0 can be a p-channel MOSFET. The transistor P1 can be a p-channel MOSFET. The core transistor mentioned in the present disclosure can be a transistor that constitutes a portion of a core device.

The source of the transistor P0 is electrically connected to the drain of the transistor P1. The drain of the transistor P0 is electrically connected to the circuit 16 at the node VX. The gate of the transistor P0 is configured to receive a reference voltage VSSH. The source of the transistor P1 is electrically connected to the supply voltage VDDH. The gate of the transistor P1 is configured to receive an input voltage VHIN.

The dummy circuit 42a' includes a plurality of transistors PDY1, PDY2, PDY3, . . . and PDYn. The number "n" is a positive integer. Each of the transistors PDY1, PDY2, PDY3, . . . and PDYn can be a p-channel MOSFET.

The source and the gate of the transistor PDY1 are connected together. The source of the transistor PDY1 is electrically connected to the drain of the transistor PDY2, and the source of the transistor PDY2 is electrically connected to the drain of the transistor PDY3, and so forth. The transistors PDY1, PDY2, PDY3, . . . and PDYn can be connected in series, with their gates shared. The source of the transistor PDYn is electrically connected to the dummy circuit 42b'. The source of the transistor PDZ1 is electrically connected to the drain of the transistor PDZ1. The source and the gate of the transistor PDYn are connected together.

The dummy circuit 42b' includes a plurality of transistors PDZ1, PDZ2, PDZ3, . . . and PDZn. The number "n" is a positive integer. Each of the transistors PDZ1, PDZ2, PDZ3, . . . and PDZn can be a p-channel MOSFET. The source of the transistor PDZ1 is electrically connected to the drain of the transistor PDZ2. The transistors PDZ2, PDZ3, . . . and PDZn all include the same configuration as the transistor PDZ1. The gates of the transistors PDZ1, PDZ2, PDZ3, . . . and PDZn are all connected to the node VX. The transistors PDZ1, PDZ2, PDZ3, . . . and PDZn can be connected in series, with their gates shared.

The dummy device 44' includes a transistor PDX. The transistor PDX can be a p-channel MOSFET. The gate, the source and the drain of the transistor PDX are connected together. The gate, the source and the drain of the transistor PDX are electrically connected to the node VX.

The operations of the device 130' are similar to those of the device 100'. In some embodiments, the supply voltage VDDH can be approximately 1.2 V. In some embodiments, the reference voltage VSSH can be approximately 0.45 V. In some embodiments, the reference voltage VMID can be approximately 0.45 V. In some embodiments, the reference voltage VSSH can be different from the reference voltage VMID. In some embodiments, the input voltage VHIN of the transistor P1 can range approximately from 0.45 V to 1.2 V. The input voltage VHIN of the transistor P1 can control the transistor P1 to be on or off.

In the condition wherein the transistor P1 is turned on, the current flow driven by the transistor P1 will pull up the voltage at the node VX. At the same time, the transistors PDX, PDY1 to PDYn, and PDZ1 to PDZn will all be in the off state since there is no voltage difference between their gates and the sources. Therefore, the dummy device 42' and the dummy device 44' will merely consume very limited current, for example, leakage current, when the transistor P1 is turned on. In addition, all the transistors of the core device 40', the dummy device 42' and the dummy device 44' will be in SOA.

It should be noted that the transistors PDY1, PDY2, PDY3, . . . and PDYn connected in series will facilitate a decrease of the leakage current, and the transistors PDZ1, PDZ2, PDZ3, . . . and PDZn connected in series will also facilitate a decrease of the leakage current. As a result, the dummy device 42' of FIG. 4B will exhibit a smaller leakage current compared to the dummy device 12' shown in FIG. 1B.

In the condition wherein the transistor P1 is turned off, the voltage at the node VX will be pulled low to nearly identical to the ground (GND). At this time, the transistors PDX, PDY1 to PDYn, and PDZ1 to PDZn will all be in the off state since there is no voltage difference between their gates and the sources. In addition, all the transistors of the core device 40', the dummy device 42' and the dummy device 44' will be in SOA.

For the dummy devices 42' and 44' that include p-channel MOSFETs, the reference voltage VMID can be defined by the equation 2.

The dummy devices described in accordance with FIGS. 1A, 1B, 2A, 2B, 3A, 3B, 4A and 4B can be widely applied to core devices that are potentially to be operated in the range of IO voltage. The circuit structure/configurations as shown in FIGS. 1A, 1B, 2A, 2B, 3A, 3B, 4A and 4B can be widely applied to core devices that are potentially to be operated in the range of IO voltage.

Table 1 below shows various conditions that the dummy devices in accordance with some embodiments of the present disclosure can be applied to. The layout patterns for the conditions 1, 2, 3 and 4 can be illustrated in FIGS. 5A, 5B, 5C and 5D, respectively.

TABLE 1

| Conditions No. | First core transistor (N0 or P0) | Second core transistor (N1 or P1) | The end of the dummy device is connected to an IO voltage |
|---|---|---|---|
| 1. | Even finger | Even finger | YES |
| 2. | Even finger | Odd finger | YES |
| 3. | Odd finger | Even finger | YES |
| 4. | Odd finger | Odd finger | YES |

FIG. 5A, FIG. 5B, FIG. 5C and FIG. 5D each illustrate a layout pattern of core devices, in which the dummy devices in accordance with some embodiments of the present disclosure can be applied.

Figure 5B:
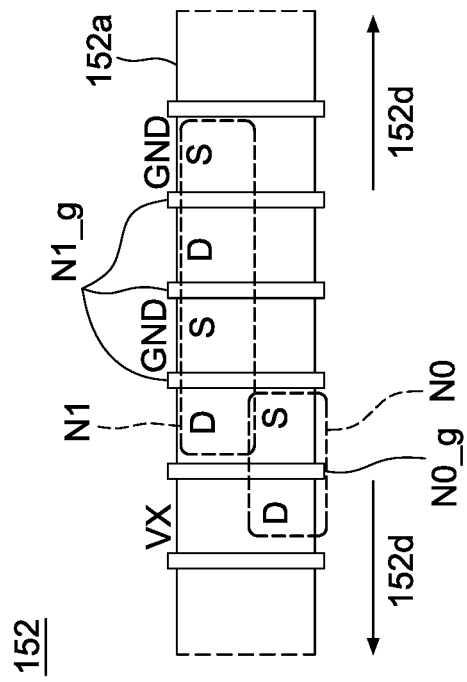
FIG. 5A, FIG. 5B, FIG. 5C and FIG. 5D each illustrate a layout pattern of core devices, in which the dummy devices in accordance with some embodiments of the present disclosure can be applied.
Figure 5A:
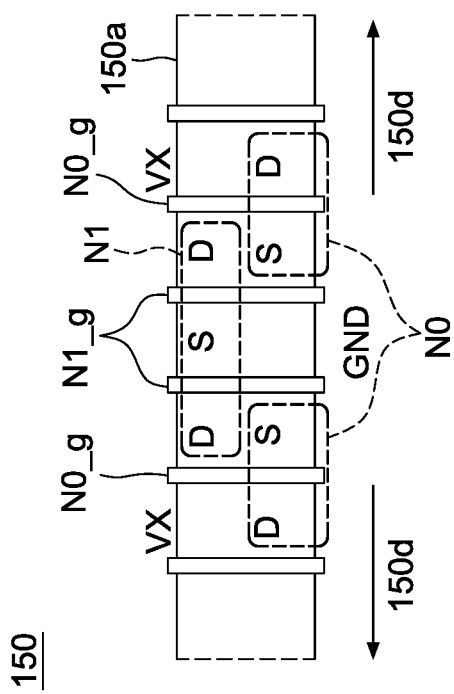

FIG. 5A shows a layout 150 of the core transistors N0 and N1. The layout 150 includes an active region 150a. The active region 150a can be referred to as a continuous active region. The core transistor N1 can include even fingers. That is, the core transistor N1 can include an even number of gates N1_g. The core transistor N0 can include even fingers. That is, the core transistor N0 can include an even number of gates N0_g.

The regions 150d shown in FIG. 5A represents the regions in which the dummy devices can be located on the layout 150.

The drain (D) of the core transistor N0 is connected to the dummy devices (i.e., regions 150d) at the node VX. Referring back to FIG. 1A, the node VX can be applied with a voltage in the range of IO voltage (for example, 1.2V). Therefore, the end of the dummy device (i.e., regions 150d) is connected to a voltage in the range of IO voltage (for example, 1.2V). For a layout in which the end of the dummy device is connected to an IO voltage, the circuit structure/configurations as shown in FIGS. 1A, 1B, 2A, 2B, 3A, 3B, 4A and 4B can be applied, so as to have the core devices and the dummy devices work in SOA.

FIG. 5B shows a layout 152 of the core transistors N0 and N1. The layout 152 includes an active region 152a. The active region 152a can be referred to as a continuous active region. The core transistor N1 can include odd fingers. That is, the core transistor N1 can include an even number of gates N1_g. The core transistor N0 can include odd fingers. That is, the core transistor N0 can include an odd number of gates N0_g.

The regions 152d shown in FIG. 5B represents the regions in which the dummy devices can be located on the layout 152.

The drain (D) of the core transistor N0 is connected to the dummy devices (i.e., region 152d) at the node VX. Referring back to FIG. 1A, the node VX can be applied with a voltage in the range of IO voltage (for example, 1.2V). Therefore, the end of the dummy device (i.e., region 152d) is connected to a voltage in the range of IO voltage (for example, 1.2V). For a layout in which the end of the dummy device is connected to an IO voltage, the circuit structure/configurations as shown in FIGS. 1A, 1B, 2A, 2B, 3A, 3B, 4A and 4B can be applied, so as to have the core devices and the dummy devices work in SOA.

Figure 5D:
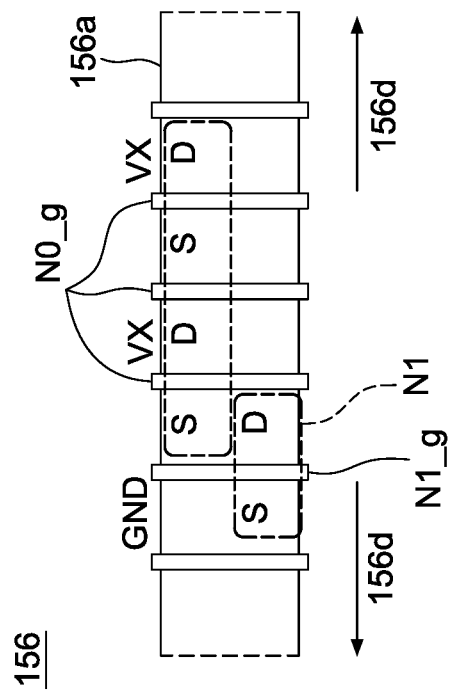
Figure 5C:
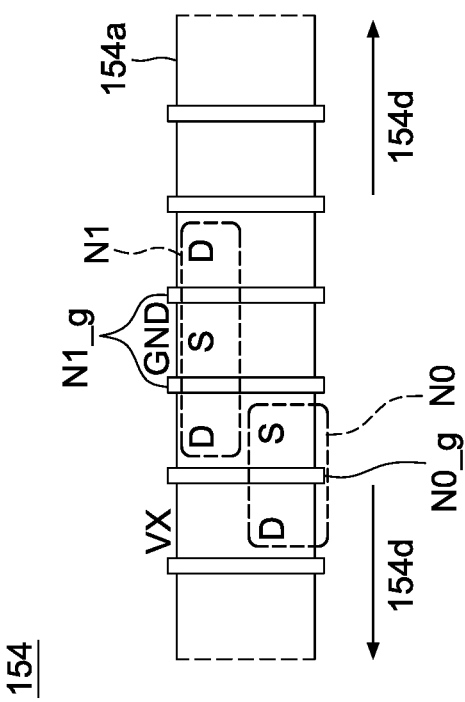

FIG. 5C shows a layout 154 of the core transistors N0 and N1. The layout 152 includes an active region 154a. The active region 154a can be referred to as a continuous active region. The core transistor N1 can include even fingers. That is, the core transistor N1 can include an even number of gates N1_g. The core transistor N0 can include odd fingers. That is, the core transistor N0 can include an odd number of gates N0_g.

The regions 154d shown in FIG. 5C represents the regions in which the dummy devices can be located on the layout 154.

The drain (D) of the core transistor N0 is connected to the dummy devices (i.e., region 154d) at the node VX. Referring back to FIG. 1A, the node VX can be applied with a voltage in the range of IO voltage (for example, 1.2V). Therefore, the end of the dummy device (i.e., region 154d) is connected to a voltage in the range of IO voltage (for example, 1.2V). For a layout in which the end of the dummy device is connected to an IO voltage, the circuit structure/configurations as shown in FIGS. 1A, 1B, 2A, 2B, 3A, 3B, 4A and 4B can be applied, so as to have the core devices and the dummy devices work in SOA.

FIG. 5D shows a layout 156 of the core transistors N0 and N1. The layout 156 includes an active region 156a. The active region 156a can be referred to as a continuous active region. The core transistor N1 can include odd fingers. That is, the core transistor N1 can include an odd number of gates N1_g. The core transistor N0 can include odd fingers. That is, the core transistor N0 can include an odd number of gates N0_g.

The regions 156d shown in FIG. 5D represents the regions in which the dummy devices can be located on the layout 156.

The drain (D) of the core transistor N0 is connected to the dummy devices (i.e., region 156d) at the node VX. Referring back to FIG. 1A, the node VX can be applied with a voltage in the range of IO voltage (for example, 1.2V). Therefore, the end of the dummy device (i.e., region 156d) is connected to a voltage in the range of IO voltage (for example, 1.2V). For a layout in which the end of the dummy device is connected to an IO voltage, the circuit structure/configurations as shown in FIGS. 1A, 1B, 2A, 2B, 3A, 3B, 4A and 4B can be applied, so as to have the core devices and the dummy devices work in SOA.

Figure 6A:
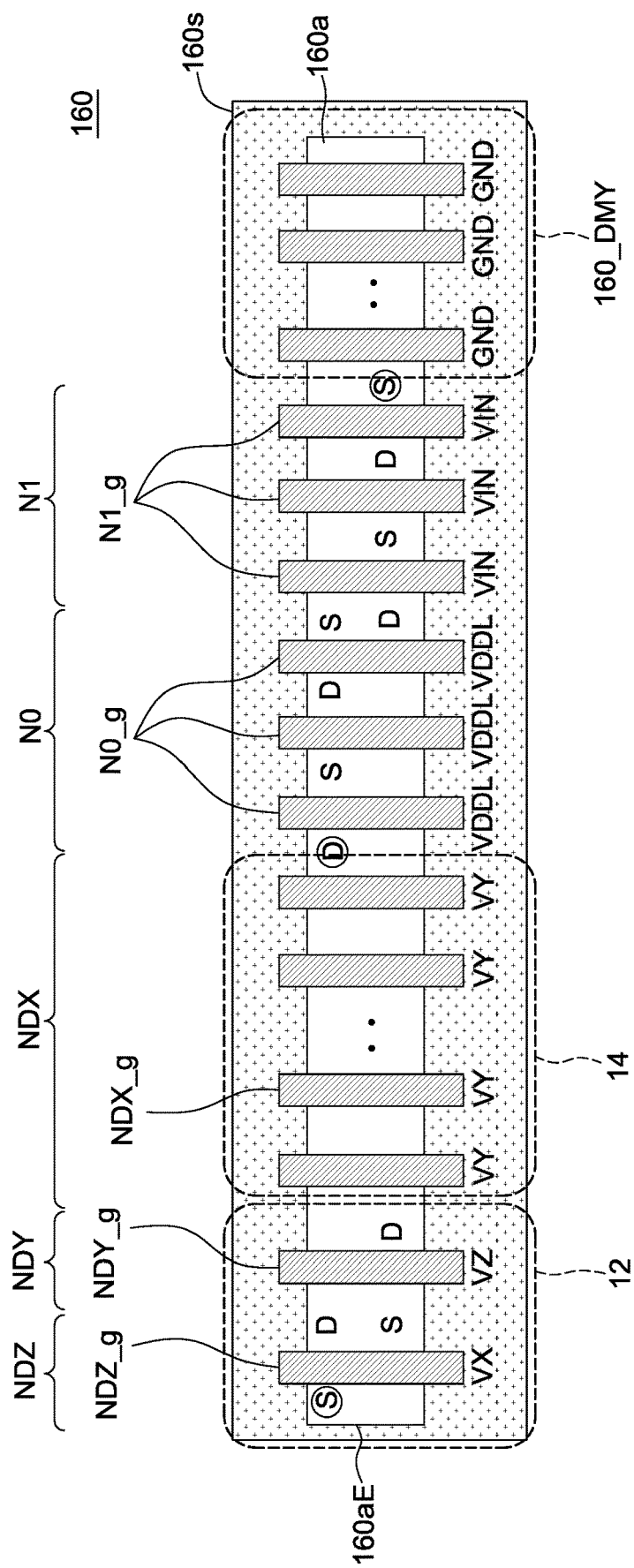
FIG. 6A illustrates a layout pattern of a semiconductor device, in accordance with some embodiments of the present disclosure.

FIG. 6A illustrates a layout pattern of a semiconductor device, in accordance with some embodiments of the present disclosure.

FIG. 6A shows a layout 160. The layout 160 can be a layout corresponding to the device 100 of FIG. 1A. The layout 160 includes a substrate 160s and an active region 160a. The active region 160a can be referred to as a continuous active region. In the layout 160, the core transistor N0 includes three fingers (i.e., gates N0_g), and the core transistor N1 includes three fingers (i.e., gates N1_g). The transistor NDX of the dummy device 14 can include a plurality of fingers (i.e., gates NDX_g). The transistors NDY and NDZ of the dummy device 12 can each include a single finger (i.e., gates NDY_g and NDZ_g).

It should be noted that the numbers of the fingers in the core transistors N0 and N1, and the numbers of the fingers in the transistors NDX, NDY and NDZ can be adjusted/modified according to different designs/purposes, and are not limited to those shown in FIG. 6A.

The drain (D) of the core transistor N0 will be connected to the node VX (referring to FIG. 1A). As previously discussed, the node VX can be pulled up to the supply voltage VDDH (i.e., a voltage in the range of IO voltage) during the operations of the device 100. Therefore, if the drain (D) of the core transistor N0 is placed at the end of the active region 160a, electrical overstress between the substrate 160s and the active region 160a may be observed during the operations of the device 100, and then the core transistor N0 may not be able to work in SOA.

In order to avoid electrical overstress between the substrate 160s and the active region 160a, dummy devices 12 and 14 can be disposed adjacent the core transistor N0 in the layout 160. Referring to the dummy device 12 shown in FIG. 6A, the source (S) of the transistor NDZ is disposed near an edge 160aE of the active region 160a.

Referring back to FIG. 1A, the source (S) of the transistor NDZ is configured to receive a reference voltage VMID, and the gate (i.e., NDZ_g) of the transistor NDZ is connected to the node VX. Under the condition wherein the reference voltage VMID is selected according to the equation 1 previously discussed, the transistors NDZ, NDY, NDX, N0 and N1 shown in the layout 160 can all work in SOA.

Referring to the source (S) of the core transistor N1 for comparison, the source of the core transistor N1 is electrically connected to the ground (GND), and thus electrical overstress between the substrate 160s and the active region 160a will not be observed if the source (S) of the core transistor N1 is placed at the end of the active region 160a. As a result, a dummy device 160_DMY pertaining to a known technique can be placed adjacent to the core transistor N1.

Figure 6B:
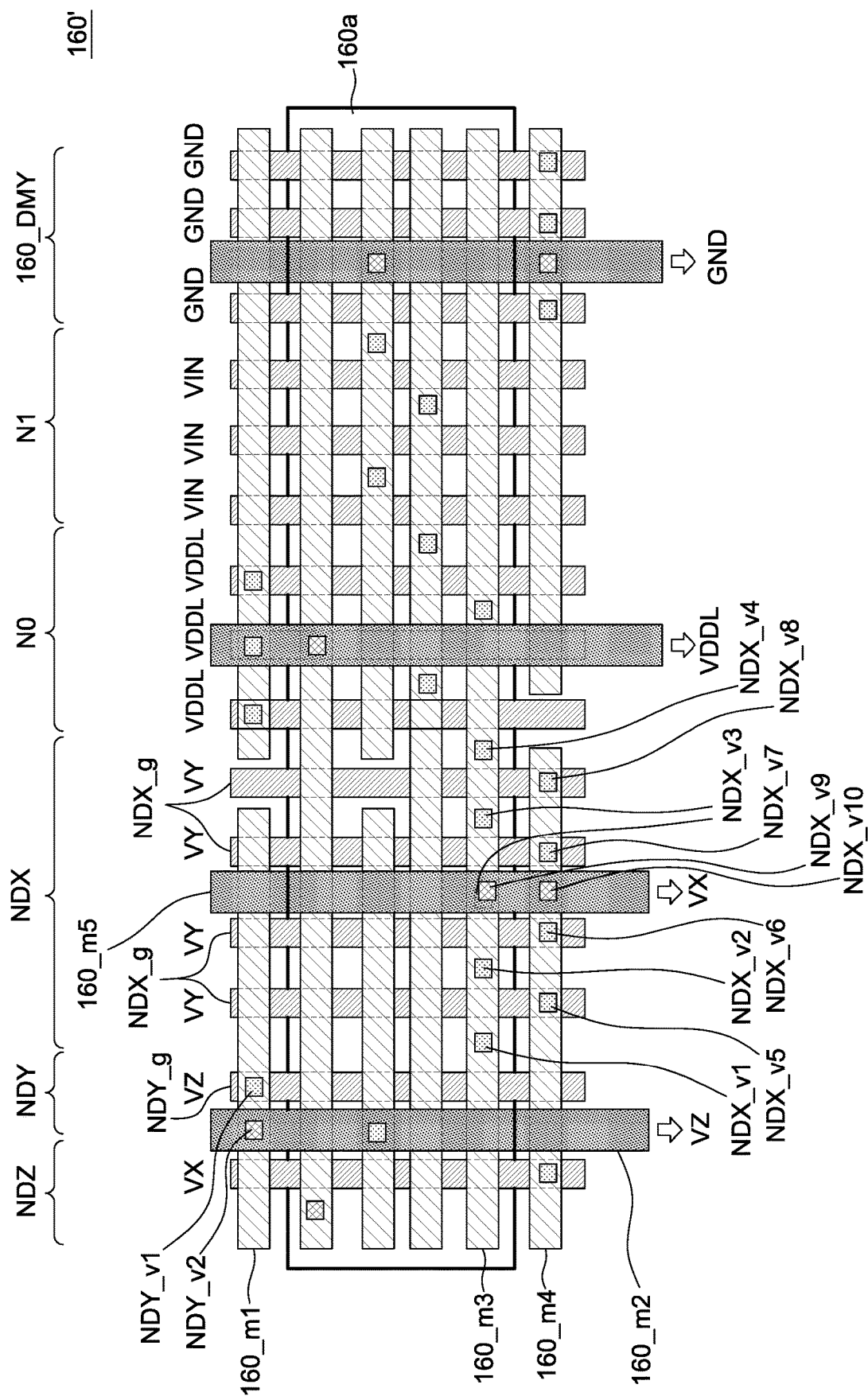
FIG. 6B illustrates a layout pattern of a semiconductor device, in accordance with some embodiments of the present disclosure.

FIG. 6B illustrates a layout pattern of a semiconductor device, in accordance with some embodiments of the present disclosure. FIG. 6B shows a layout 160'. The layout 160' can be a layout corresponding to the device 100 of FIG. 1A. The layout 160' is similar to the layout 160 of FIG. 6A, except that the layout 160' further includes metal layers and conductive vias.

The layout 160' shows that the placing and routing of the circuit structure as proposed in FIG. 1A can be accomplished in a concise manner. Referring to the transistor NDY in the layout 160', the gate NDY_g of the transistor NDY can be electrically connected to the source of the transistor NDY through the conductive via NDY_v1, the metal layer 160_m1, and the conductive via NDY_v2. The source of the transistor NDY can be electrically connected to the node VZ (referring back to FIG. 1A) through the metal layer 160_m2.

Referring to the transistor NDX in the layout 160', the drain and the source of the transistor NDX can be electrically connected together through the metal layer 160_m3 and the conductive vias NDX_v1, NDX_v2, NDX_v3, and NDX_v4. The gate NDX_g of the transistor NDX can be electrically connected to the drain and the source of the transistor NDX through the conductive vias NDX_v5, NDX_v6, NDX_v7, NDX_v8, the metal layer 160_m4, the metal layer 160_m5, and the conductive vias NDX_v9 and NDX_v10. The gate, the source and the drain of the transistor NDX can be electrically connected to the node VX (referring back to FIG. 1A).

Figure 7A:
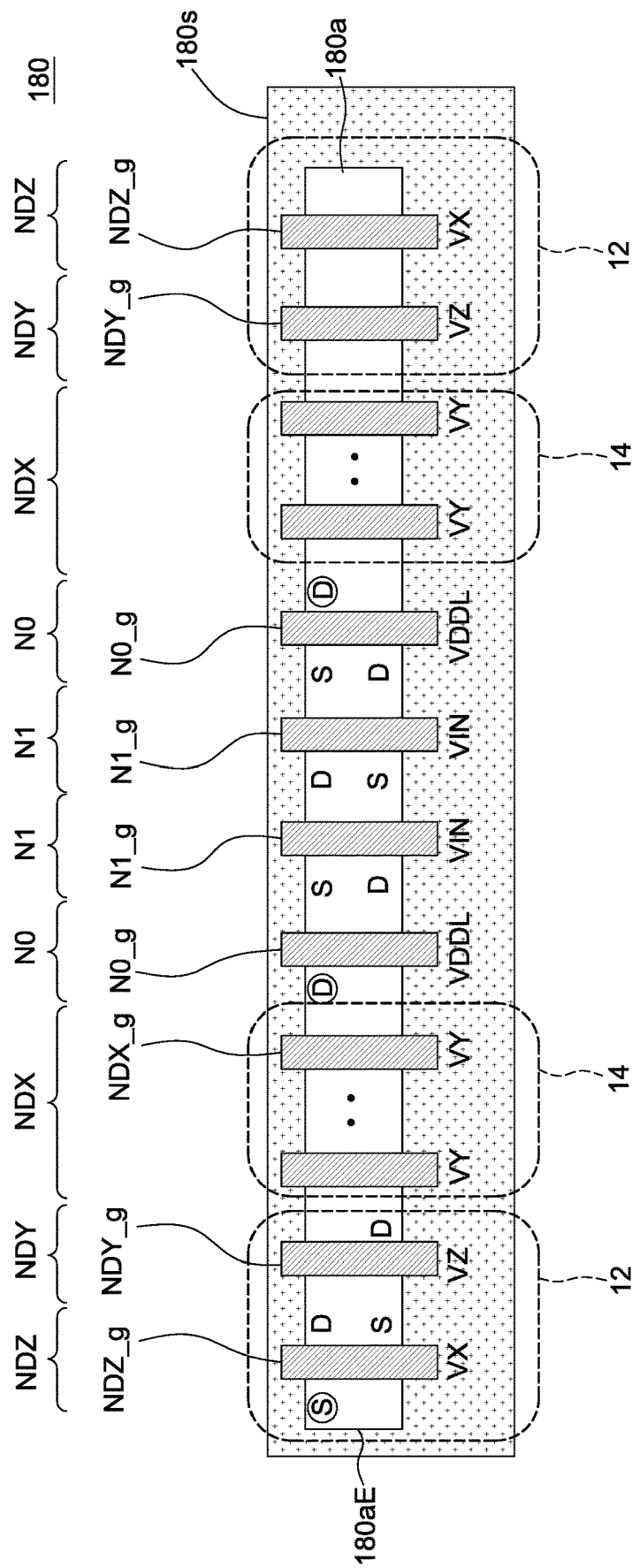
FIG. 7A illustrates a layout pattern of a semiconductor device, in accordance with some embodiments of the present disclosure.

FIG. 7A illustrates a layout pattern of a semiconductor device, in accordance with some embodiments of the present disclosure.

FIG. 7A shows a layout 180. The layout 180 can be a layout corresponding to the device 100 of FIG. 1A. The layout 180 includes a substrate 180s and an active region 180a.

The active region 180a can be referred to as a continuous active region. In the layout 180, the core transistor N0 includes two fingers (i.e., gates N0_g), and the core transistor N1 includes two fingers (i.e., gates N1_g). The transistor NDX of the dummy device 14 can include a plurality of fingers (i.e., gates NDX_g). The transistors NDY and NDZ of the dummy device 12 can each include two fingers (i.e., gates NDY_g and NDZ_g).

Compared to the layout 160 shown in FIG. 6A, in the layout 180, the dummy device 12 can be disposed on both sides of the layout 180 (i.e., the leftmost side and the rightmost side). In addition, the dummy device 14 can be disposed on both sides of the layout 180 (i.e., the leftmost side and the rightmost side). The dummy device 12 can be disposed on both sides of the transistor N0, and dummy device 14 can be disposed on both sides of the transistor N0.

It should be noted that the numbers of the fingers in the core transistors N0 and N1, and the numbers of the fingers in the transistors NDX, NDY and NDZ can be adjusted/modified according to different designs/purposes, and are not limited to those shown in FIG. 7A.

The drain (D) of the core transistor N0 will be connected to the node VX (referring to FIG. 1A). As previously discussed, the node VX can be pulled up to the supply voltage VDDH (i.e., a voltage in the range of IO voltage) during the operations of the device 100. Therefore, if the drain (D) of the core transistor N0 is placed at the end of the active region 180a, electrical overstress between the substrate 180s and the active region 180a may be observed during the operations of the device 100, and then the core transistor N0 may not be able to work in SOA.

In order to avoid electrical overstress between the substrate 180s and the active region 180a, dummy devices 12 and 14 can be disposed adjacent the core transistor N0 in the layout 180. Referring to the dummy device 12 shown in FIG. 7A, the source (S) of the transistor NDZ is disposed near an edge 180aE of the active region 180a.

Referring back to FIG. 1A, the source (S) of the transistor NDZ is configured to receive a reference voltage VMID, and the gate (i.e., NDZ_g) of the transistor NDZ is connected to the node VX. Under the condition wherein the reference voltage VMID is selected according to the equation 1 previously discussed, the transistors NDZ, NDY, NDX, N0 and N1 shown in the layout 180 can all work in SOA.

Figure 7B:
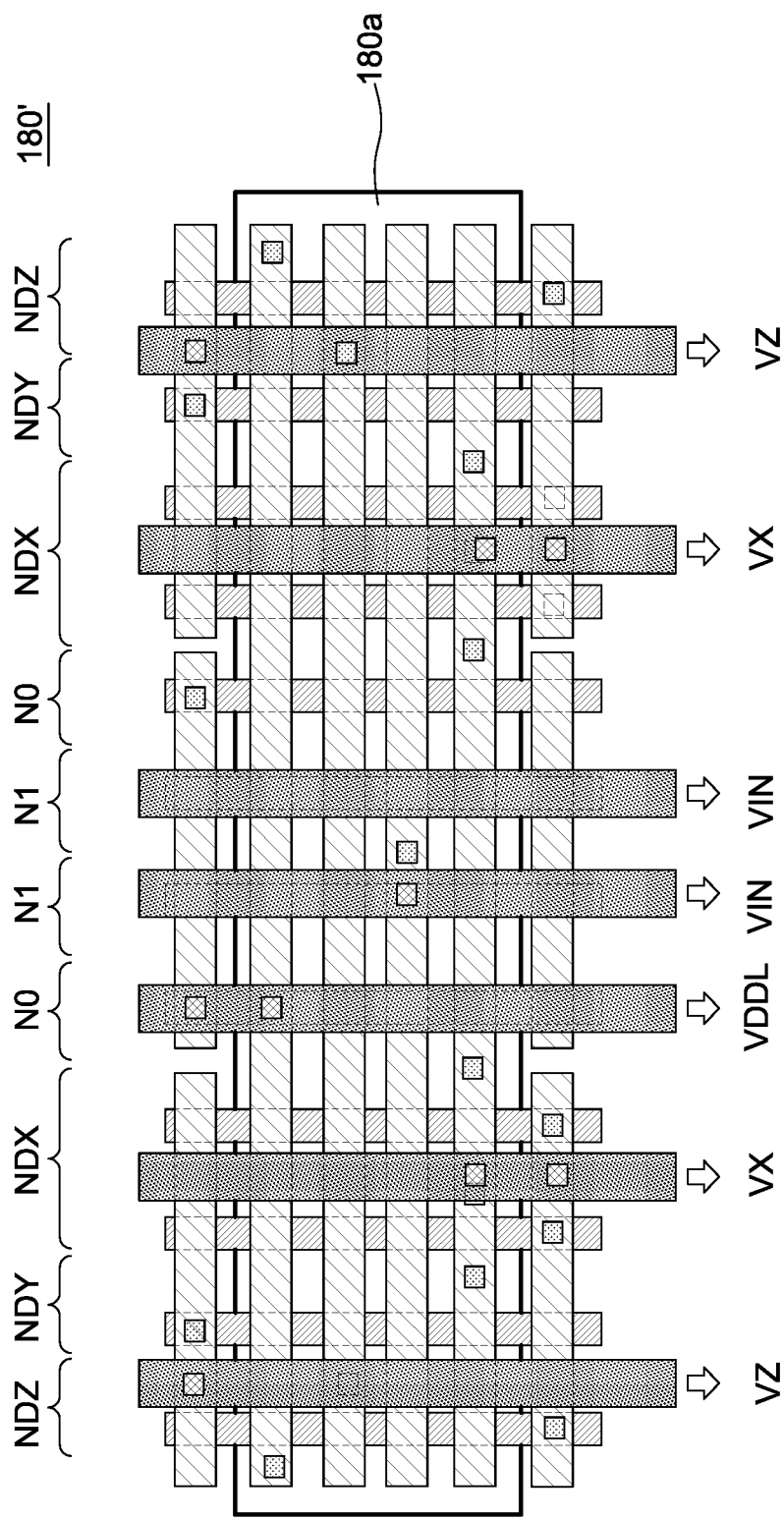
FIG. 7B illustrates a layout pattern of a semiconductor device, in accordance with some embodiments of the present disclosure.

FIG. 7B illustrates a layout pattern of a semiconductor device, in accordance with some embodiments of the present disclosure. FIG. 7B shows a layout 180'. The layout 180' can be a layout corresponding to the device 100 of FIG. 1A. The layout 180' is similar to the layout 180 of FIG. 7A, except that the layout 180' further includes metal layers and conductive vias.

The layout 180' shows that the placing and routing of the circuit structure as proposed in FIG. 1A can be accomplished in a concise manner. The configurations of the transistors N0, N1, NDX, NDY and NDZ of the layout 180' can be understood in a similar manner as that described in accordance with FIG. 6B.

Figure 8B:
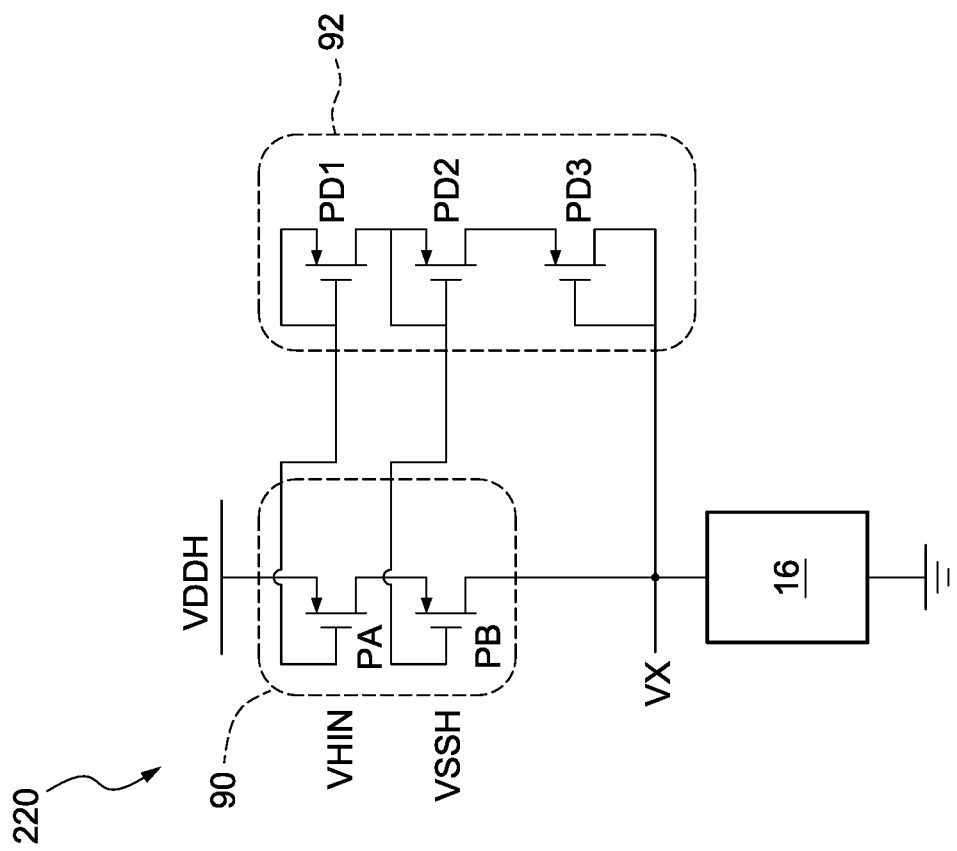
FIG. 8B illustrates a schematic view of a semiconductor device, in accordance with some embodiments of the present disclosure.
Figure 8A:
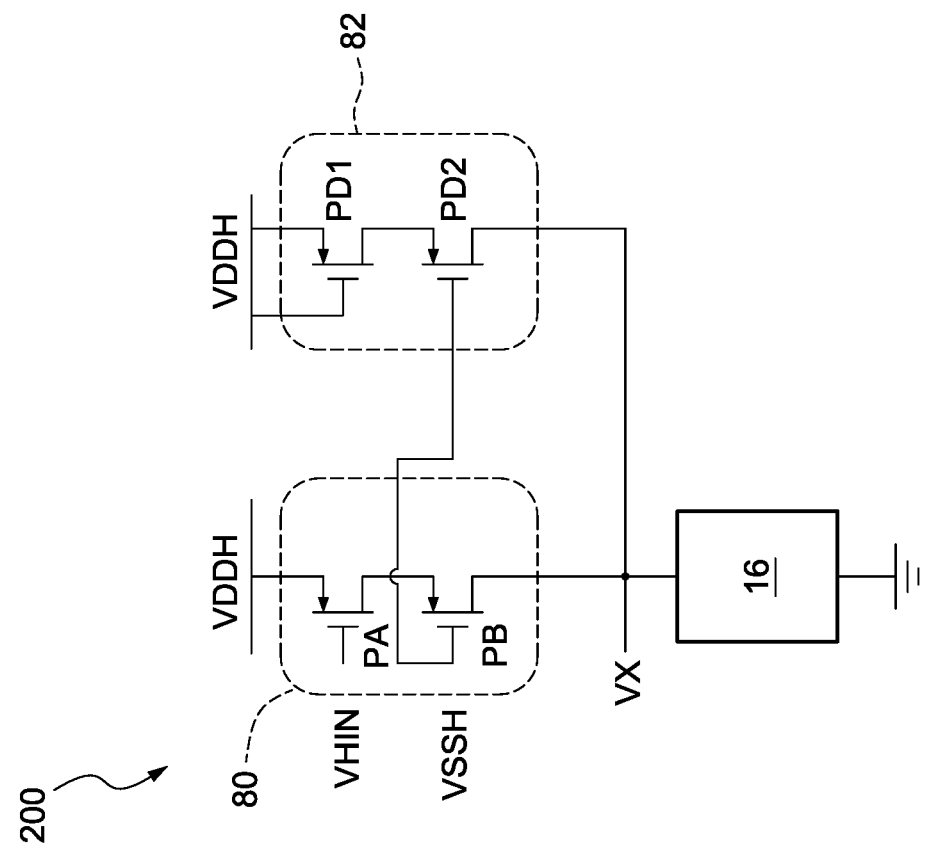
FIG. 8A illustrates a schematic view of a semiconductor device, in accordance with some embodiments of the present disclosure.

FIG. 8A illustrates a schematic view of a semiconductor device, in accordance with some embodiments of the present disclosure.

FIG. 8A shows a device 200. The device 200 can be an electrical device. The device 200 can be a semiconductor device. The device 200 can be a system of integrated circuits (IC). The device 200 includes a core device 80, a dummy device 82, and a circuit 16.

The core device 80 is electrically connected between the circuit 16 and a supply voltage VDDH. The circuit 16 is electrically connected to the ground (GND). The circuit 16 is electrically connected to the node VX. The dummy device 82 is electrically connected to the node VX. The dummy device 82 is electrically connected to the core device 80. The dummy device 82 is electrically connected to the supply voltage VDDH.

The core device 80 includes a transistor PA and a transistor PB. The transistor PA can be referred to as a core transistor. The transistor PB can be referred to as a core transistor. The transistor PA can be a p-channel MOSFET. The transistor PB can be a p-channel MOSFET. The core transistor mentioned in the present disclosure can be a transistor that constitutes a portion of a core device.

The source of the transistor PB is electrically connected to the drain of the transistor PA. The drain of the transistor PB is electrically connected to the circuit 16 at the node VX. The gate of the transistor PB is configured to receive a reference voltage VSSH. The source of the transistor PA is electrically connected to the supply voltage VDDH. The gate of the transistor PA is configured to receive an input voltage VHIN.

The dummy device 82 includes a transistor PD1 and a transistor PD2. The transistor PD1 can be a p-channel MOSFET. The transistor PD2 can be a p-channel MOSFET. The source of the transistor PD2 is electrically connected to the drain of the transistor PD1. The source of the transistor PD1 is electrically connected to the gate of the transistor PD1. The source and the gate of the transistor PD1 is configured to receive the supply voltage VDDH.

The drain of the transistor PD2 is electrically connected to the node VX. The gate of the transistor PD2 is electrically connected to the gate of the transistor PB. That is, the dummy device 82 will use the same bias as the core device 80, and thus electrical overstress can be avoided.

The operations of the device 200 will be described as follows. In some embodiments, the supply voltage VDDH can be approximately 1.8 V. In some embodiments, the reference voltage VSSH can be approximately 0.85 V. In some embodiments, the input voltage VHIN of the transistor PA can range approximately from 1.1 V to 1.8 V. The input voltage VHIN of the transistor PA can control the transistor PA to be on or off.

When the transistor PA is turned off, the voltage applied to the gate of the transistor PA can be 1.8 V, and the voltage at the node VX will be approximately identical to 0 V. The reference voltage VSSH applied to the gate of the transistor PB can be 0.85 V. The transistor PD1 will be turned off since its VGS is equal to zero. At the same time, the transistors PD1 and PD2 will both work in SOA.

When the transistor PA is turned on, the voltage applied to the gate of the transistor PA can be 1.1 V, and the voltage at the node VX will be pulled up to approximately 1.8 V. The reference voltage VSSH applied to the gate of the transistor PB can be 0.85 V. The transistor PD1 will be turned off since its VGS is equal to zero. At the same time, the transistors PD1 and PD2 will both work in SOA.

FIG. 8B illustrates a schematic view of a semiconductor device, in accordance with some embodiments of the present disclosure.

FIG. 8A shows a device 220. The device 220 can be an electrical device. The device 220 can be a semiconductor device. The device 220 can be a system of integrated circuits (IC). The device 220 includes a core device 90, a dummy device 92, and a circuit 16.

The core device 90 is electrically connected between the circuit 16 and a supply voltage VDDH. The circuit 16 is electrically connected to the ground (GND). The circuit 16 is electrically connected to the node VX. The dummy device 92 is electrically connected to the node VX. The dummy device 92 is electrically connected to the core device 90.

The core device 90 includes a transistor PA and a transistor PB. The transistor PA can be referred to as a core transistor. The transistor PB can be referred to as a core transistor. The transistor PA can be a p-channel MOSFET. The transistor PB can be a p-channel MOSFET. The core transistor mentioned in the present disclosure can be a transistor that constitutes a portion of a core device.

The source of the transistor PB is electrically connected to the drain of the transistor PA. The drain of the transistor PB is electrically connected to the circuit 16 at the node VX. The gate of the transistor PB is configured to receive a reference voltage VSSH. The source of the transistor PA is electrically connected to the supply voltage VDDH. The gate of the transistor PA is configured to receive an input voltage VHIN.

The dummy device 92 includes transistors PD1, PD2 and PD3. The transistor PD1 can be a p-channel MOSFET. The transistor PD2 can be a p-channel MOSFET. The transistor PD3 can be a p-channel MOSFET.

The source of the transistor PD2 is electrically connected to the drain of the transistor PD1. The source of the transistor PD1 is electrically connected to the gate of the transistor PD1. The source and the gate of the transistor PD1 is connected together, and is electrically connected to the gate of the transistor PA. The source and the gate of the transistor PD1 is configured to receive the input voltage VHIN.

The drain of the transistor PD2 is electrically connected to the source of the transistor PD3. The gate of the transistor PD2 is electrically connected to the gate of the transistor PB, and is configured to receive the reference voltage VSSH. That is, the dummy device 92 will use the same bias as the core device 90, and thus electrical overstress can be avoided. The drain and the gate of the transistor PD3 is connected together. The drain of the transistor PD3 is electrically connected to the node VX.

The operations of the device 220 will be described as follows. In some embodiments, the supply voltage VDDH can be approximately 1.8 V. In some embodiments, the reference voltage VSSH can be approximately 0.85 V. In some embodiments, the input voltage VHIN of the transistor PA can range approximately from 1.1 V to 1.8 V. The input voltage VHIN of the transistor PA can control the transistor PA to be on or off.

When the transistor PA is turned off, the voltage applied to the gate of the transistor PA can be 1.8 V, and the voltage at the node VX will be approximately identical to 0 V. The reference voltage VSSH applied to the gate of the transistor PB can be 0.85 V. The transistors PD1 and PD2 will be turned off since their VGS are equal to zero. At the same time, the transistors PD1, PD2 and PD3 will all work in SOA.

When the transistor PA is turned on, the voltage applied to the gate of the transistor PA can be 1.1 V, and the voltage at the node VX will be pulled up to approximately 1.8 V. The reference voltage VSSH applied to the gate of the transistor PB can be 0.85 V. The transistors PD1 and PD2 will be turned off since their VGS are equal to zero. At the same time, the transistors PD1, PD2 and PD3 will all work in SOA.

Figure 9A:
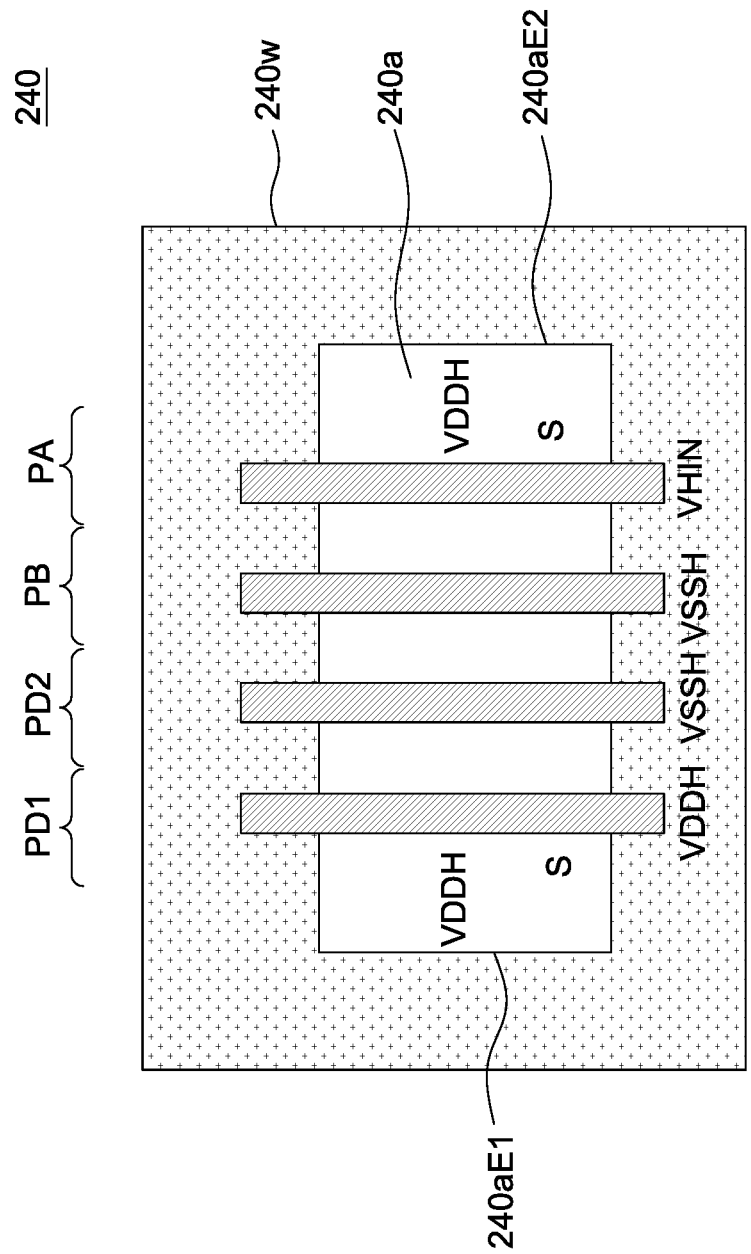
FIG. 9A illustrates a layout pattern of a semiconductor device, in accordance with some embodiments of the present disclosure.

FIG. 9A illustrates a layout pattern of a semiconductor device, in accordance with some embodiments of the present disclosure.

FIG. 9A shows a layout 240. The layout 240 can be a layout corresponding to the device 200 of FIG. 8A. The layout 240 includes a well region 240w and an active region 240a. In some embodiments, the well region 240w can be an n-type well. In some embodiments, the active region 240a can be doped with p-type impurities. Although not depicted in FIG. 9A, it should be understood that the well region 240w and an active region 240a can be disposed on a substrate.

The gate of the transistor PD1 is configured to receive the supply voltage VDDH. The gate of the transistor PD2 is configured to receive the reference voltage VSSH. The gate of the transistor PB is configured to receive the reference voltage VSSH. The gate of the transistor PA is configured to receive the input voltage VHIN. The well region 240w is electrically connected to the supply voltage VDDH.

The source (S) of the transistor PD1 is disposed adjacent to an edge 240aE1 of the active region 240a, and is electrically connected to the supply voltage VDDH. The source (S) of the transistor PA is disposed adjacent to an edge 240aE2 of the active region 240a, and is electrically connected to the supply voltage VDDH.

Referring to the transistors PD1 and PA on the layout 240, since the source (S) of the transistor PD1, the source (S) of the transistor PA, and the well region 240w are all electrically connected to the supply voltage VDDH, no voltage difference exists between the active region 240a and the well region 240w. Therefore, no electrical overstress between the active region 240a and the well region 240w will be observed, and all the transistors PD1, PD2, PA and PB of the layout 240 can work in SOA.

Figure 9B:
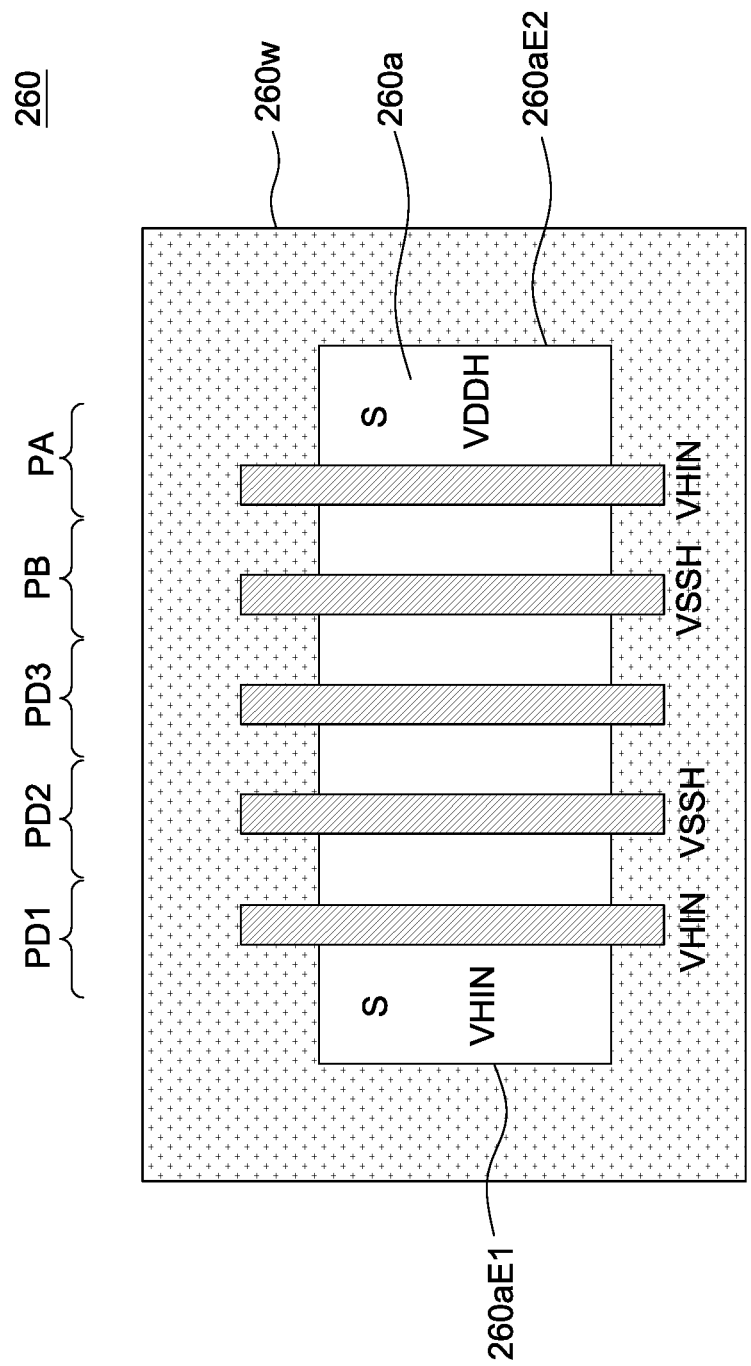
FIG. 9B illustrates a layout pattern of a semiconductor device, in accordance with some embodiments of the present disclosure.

FIG. 9B illustrates a layout pattern of a semiconductor device, in accordance with some embodiments of the present disclosure.

FIG. 9B shows a layout 260. The layout 260 can be a layout corresponding to the device 220 of FIG. 8B. The layout 260 includes a well region 260w and an active region 260a. In some embodiments, the well region 260w can be an n-type well. In some embodiments, the active region 260a can be doped with p-type impurities. Although not depicted in FIG. 9B, it should be understood that the well region 260w and an active region 260a can be disposed on a substrate.

The gate of the transistor PD1 is configured to receive the input voltage VHIN, which can range from 1.1 V to 1.8 V. The gate of the transistor PD2 is configured to receive the reference voltage VSSH. The gate of the transistor PB is configured to receive the reference voltage VSSH.

The gate of the transistor PA is configured to receive the input voltage VHIN. The well region 260w is electrically connected to the supply voltage VDDH. The source (S) of the transistor PD1 is disposed adjacent to an edge 260aE1 of the active region 260a, and is electrically connected to the input voltage VHIN. The source (S) of the transistor PA is disposed adjacent to an edge 260aE2 of the active region 260a, and is electrically connected to the supply voltage VDDH.

Referring to the transistor PA on the layout 260, since the source (S) of the transistor PA and the well region 260w are both electrically connected to the supply voltage VDDH, no voltage difference exists between the active region 260a and the well region 260w. In addition, referring to the transistor PD1 on the layout 260, the source (S) of the transistor PD1 is electrically to the input voltage VHIN, which can range from 1.1 V to 1.8V, and the well region 260w is electrically connected to the supply voltage VDDH, which can be 1.8 V. Therefore, no electrical overstress between the active region 260a and the well region 260w will be observed, and all the transistors PD1, PD2, PD3, PA and PB of the layout 260 can work in SOA.

Figure 10:
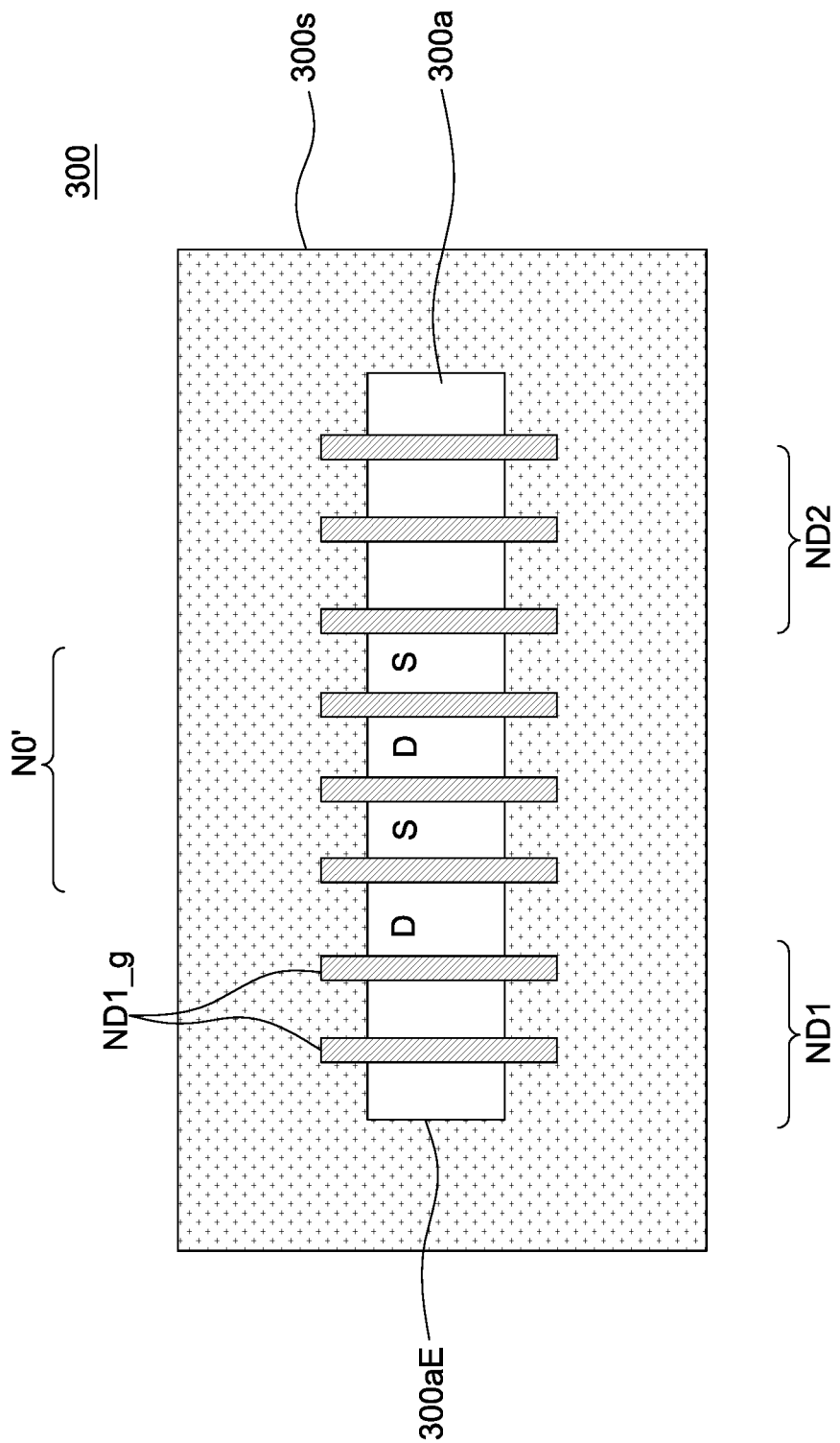
FIG. 10 illustrates a layout pattern of a semiconductor device, in accordance with some comparative embodiments of the present disclosure.

FIG. 10 illustrates a layout pattern of a semiconductor device, in accordance with some comparative embodiments of the present disclosure.

FIG. 10 shows a layout 300. The layout 300 includes a substrate 300s and an active region 300a. A core transistor N0' is disposed in the middle of the layout 300, while two dummy transistors ND1 and ND2 are disposed on two sides of the core transistor N0'. The drain (D) of core transistor N0' near an edge 300aE of the active region 300a can be applied with a voltage in the range of IO voltage (for example, 1.2 V). The dummy transistors ND1 and ND2 are configured according to existing techniques. Taking the dummy transistor ND1 as an example, the gate ND1_g, the drain and the source of the dummy transistor ND1 are all connected to the ground (GND). In addition, the substrate 300s will be connected to the ground (GND).

As a result, electrical overstress between the substrate 300s and the active region 300a may be observed, because the drain (D) of core transistor N0' can be applied with a voltage in the range of IO voltage (for example, 1.2 V). Therefore, for a core transistor that is operated in the range of IO voltage, the dummy transistors configured according to existing techniques are not applicable.

Figure 11:
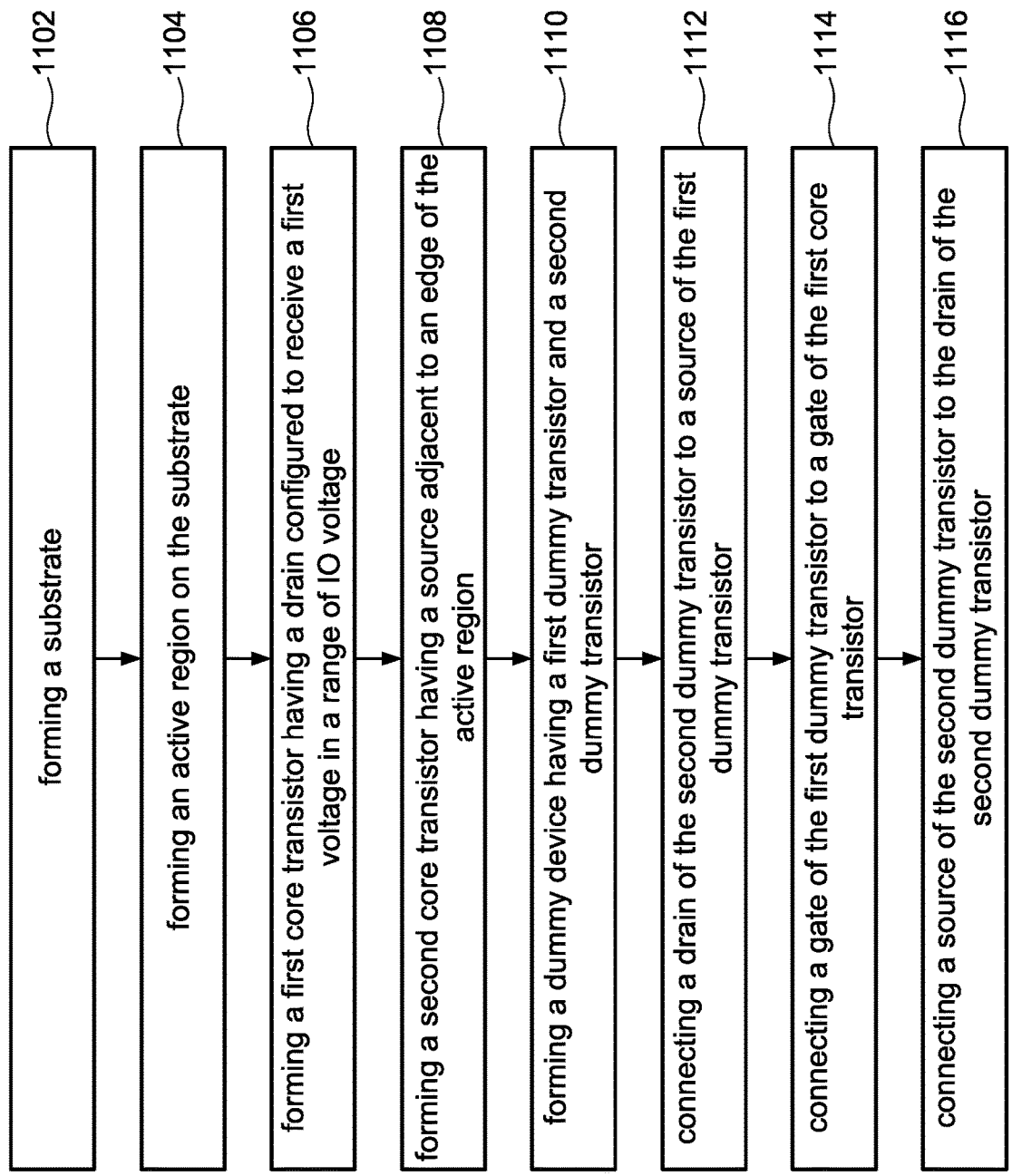
FIG. 11 illustrates a flow chart including operations for manufacturing a semiconductor device, in accordance with some embodiments of the present disclosure.

FIG. 11 illustrates a flow chart including operations for manufacturing a semiconductor device, in accordance with some embodiments of the present disclosure.

FIG. 11 includes operations 1102, 1104, 1106, 1108, 1110, 1112, 1114 and 1116 for manufacturing a semiconductor device. In the operation 1102, a substrate is formed. The substrate formed in the operation 1102 may include, for example, but is not limited to, silicon (Si), doped Si, silicon carbide (SiC), germanium silicide (SiGe), gallium arsenide (GaAs), or other semiconductor materials. The substrate formed in the operation 1102 may include, for example, but is not limited to, sapphire, silicon on insulator (SOI), or other suitable materials. In some embodiments, the substrate formed in the operation 1102 may include a silicon material. In some embodiments, the substrate formed in the operation 1102 may be a silicon substrate.

In the operation 1104, an active region can be formed on the substrate. The active region formed in the operation 1104 can correspond to the active region 240a of FIG. 9A, or the active region 260a of FIG. 9B.

In the operation 1106, a first core transistor having a drain configured to receive a first voltage in a range of IO voltage is formed. The first core transistor formed in the operation 1106 can correspond to the core transistor PB of FIG. 8A or the core transistor PB of FIG. 8B. The core transistor PB of FIG. 8A has a drain configured to receive a voltage at the node VX, which is in a range of IO voltage. The core transistor PB of FIG. 8B has a drain configured to receive a voltage at the node VX, which is in a range of IO voltage.

In the operation 1108, a second core transistor having a source adjacent to an edge of the active region is formed. The second core transistor formed in the operation 1108 can correspond to the core transistor PA of FIG. 8A or the core transistor PA of FIG. 8B. Referring to FIG. 9A, the source (S) of the core transistor PA is disposed adjacent to an edge 240aE2 of the active region 240a. Similarly, referring to FIG. 9B, the source (S) of the core transistor PA is disposed adjacent to an edge 260aE2 of the active region 260a.

In the operation 1110, a dummy device having a first dummy transistor and a second dummy transistor is formed. The first dummy transistor formed in the operation 1110 can correspond to the dummy transistor PD2 of FIG. 8A or FIG. 8B. The second dummy transistor formed in the operation 1110 can correspond to the dummy transistor PD1 of FIG. 8A or FIG. 8B.

In the operation 1112, a drain of the second dummy transistor is connected to a source of the first dummy transistor. Referring to FIG. 8A or FIG. 8B, the drain of the dummy transistor PD1 is connected to the source of the dummy transistor PD2.

In the operation 1114, a gate of the first dummy transistor is connected to a gate of the first core transistor. Referring to FIG. 8A or FIG. 8B, a gate of the dummy transistor PD2 is connected to a gate of the core transistor PB.

In the operation 1116, a source of the second dummy transistor is connected to the drain of the second dummy transistor. Referring to FIG. 8A or FIG. 8B, the source of the dummy transistor PD1 is connected to the drain of the dummy transistor PD1.

Some embodiments of the present disclosure provide a semiconductor device. The semiconductor device comprises a core transistor having a drain configured to receive a first voltage, and a first dummy device connected to the drain of the core transistor, the first dummy device having a first dummy transistor and a second dummy transistor. Wherein a gate and a source of the first dummy transistor are connected to each other. Wherein a drain of the second dummy transistor is connected to the source of the first dummy transistor. Wherein a gate of the second dummy transistor is connected to the drain of the core transistor.

Some embodiments of the present disclosure provide a semiconductor device. The semiconductor device comprises a substrate, a continuous active region on the substrate, and a core transistor having a drain configured to receive a first voltage. The semiconductor device further comprises a dummy device connected to the drain of the core transistor, the dummy device having a first dummy transistor and a second dummy transistor. Wherein a drain of the second dummy transistor is connected to the source of the first dummy transistor, and wherein a source of the second dummy transistor is disposed adjacent to an edge of the continuous active region.

Some embodiments of the present disclosure provide a method for manufacturing a semiconductor device. The method comprises forming a first core transistor having a drain configured to receive a first voltage in a range of IO voltage. The method comprises forming a dummy device having a first dummy transistor and a second dummy transistor. The method comprises connecting a drain of the second dummy transistor to a source of the first dummy transistor. The method further comprises connecting a gate of the first dummy transistor to a gate of the first core transistor.

The foregoing outlines structures of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device for enabling a core devices to operate in a safe operating area, comprising:
   a core transistor of the core device having a drain configured to receive a first voltage;
   a first dummy device connected to the drain of the core transistor, the first dummy device having a first dummy transistor and a second dummy transistor, wherein
   a gate and a source of the first dummy transistor are connected to each other,
   a drain of the second dummy transistor is connected to the source of the first dummy transistor, and
   a gate of the second dummy transistor is connected to the drain of the core transistor; and
   a second dummy device connected between the first dummy device and the core transistor, wherein the second dummy device comprises a third dummy transistor, and wherein a gate, a source and a drain of the third dummy transistor are connected together.

2. The semiconductor device of claim 1, wherein a source of the second dummy transistor is configured to receive a first reference voltage.

3. The semiconductor device of claim 2, wherein a gate of the core transistor is configured to receive a second reference voltage.

4. The semiconductor device of claim 3, wherein the first reference voltage is identical to the second reference voltage.

5. The semiconductor device of claim 2, wherein a difference between the first voltage and the first reference voltage is less than a safe operating area limit of the core transistor.

6. The semiconductor device of claim 2, wherein the first reference voltage is less than a safe operating area limit of the core transistor.

7. A semiconductor device for enabling a core devices to operate in a safe operating area, comprising:
   a substrate;
   a continuous active region on the substrate;
   a core transistor of the core device having a drain configured to receive a first voltage;
   a first dummy device connected to the drain of the core transistor, the first dummy device having a first dummy transistor and a second dummy transistor, wherein
   a drain of the second dummy transistor is connected to the source of the first dummy transistor, and
   a source of the second dummy transistor is disposed adjacent to an edge of the continuous active region; and
   a second dummy device connected between the first dummy device and the core transistor, wherein the second dummy device comprises a third dummy transistor, and wherein a gate, a source and a drain of the third dummy transistor are connected together.

8. The semiconductor device of claim 7, wherein a gate and a source of the first dummy transistor are connected to each other.

9. The semiconductor device of claim 7, wherein the source of the second dummy transistor is configured to receive a first reference voltage.

10. The semiconductor device of claim 9, wherein a gate of the core transistor is configured to receive a second reference voltage.

11. The semiconductor device of claim 7, wherein the first dummy transistor has a first threshold voltage and the second dummy transistor has a second threshold voltage, and wherein the first threshold voltage is different than the second threshold voltage.

12. The semiconductor device of claim 7, wherein the first voltage is an input/output (IO) voltage greater than approximately 1.2 volts (V).

13. The semiconductor device of claim 9, wherein a difference between the first voltage and the first reference voltage is less than a safe operating area limit of the core transistor.

14. A semiconductor device for enabling a core devices to operate in a safe operating area, comprising:
   a core transistor of the core device having a drain configured to receive a first voltage;

a first dummy device connected to the drain of the core transistor, the first dummy device having a first dummy transistor and a second dummy transistor, wherein a drain of the first dummy transistor is coupled to the drain of the core transistor, a gate and a source of the first dummy transistor are connected to each other, a drain of the second dummy transistor is connected to the source of the first dummy transistor, and a gate and a source of the second dummy transistor are connected to each other; and a second dummy device connected between the first dummy device and the core transistor, wherein the second dummy device comprises a third dummy transistor, and wherein a gate, a source and a drain of the third dummy transistor are connected together.

15. The semiconductor device of claim 14, wherein a source of the second dummy transistor is configured to receive a first reference voltage.

16. The semiconductor device of claim 15, wherein a gate of the core transistor is configured to receive a second reference voltage.

17. The semiconductor device of claim 16, wherein the first reference voltage is identical to the second reference voltage.

18. The semiconductor device of claim 15, wherein a difference between the first voltage and the first reference voltage is less than a safe operating area limit of the core transistor.

19. The semiconductor device of claim 10, wherein the first reference voltage is identical to the second reference voltage.

20. The semiconductor device of claim 15, wherein the first reference voltage is less than a safe operating area limit of the core transistor.

* * * * *